(12) United States Patent
Kumura et al.

(10) Patent No.: US 6,680,499 B2
(45) Date of Patent: Jan. 20, 2004

(54) SEMICONDUCTOR DEVICE AND METHOD OF MANUFACTURING THE SAME

(75) Inventors: Yoshinori Kumura, Yokohama (JP); Hiroyuki Kanaya, Yokohama (JP); Iwao Kunishima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/988,138

(22) Filed: Nov. 19, 2001

(65) Prior Publication Data

US 2002/0075736 A1 Jun. 20, 2002

(30) Foreign Application Priority Data

Nov. 20, 2000 (JP) ........................................ 2000-352265
Nov. 7, 2001 (JP) ........................................ 2001-341392

(51) Int. Cl.[7] ............................................. H01L 29/76
(52) U.S. Cl. .................... 257/295; 257/295; 365/145; 365/149; 361/313
(58) Field of Search ........................ 365/145, 149; 257/295; 361/313

(56) References Cited

U.S. PATENT DOCUMENTS 5,206,788 A * 4/1993 Larson et al. ............... 361/313

6,198,652 B1 * 3/2001 Kawakubo et al. ......... 365/145

FOREIGN PATENT DOCUMENTS

| JP | 5-198820 | 8/1993 |
| JP | 5-259391 | 10/1993 |
| JP | 6-76562 | 3/1994 |
| JP | 7-86528 | 3/1995 |
| JP | 9-275192 | 10/1997 |
| JP | 10-93030 | 4/1998 |
| JP | 10-255483 | 9/1998 |

* cited by examiner

Primary Examiner—David Nelms
Assistant Examiner—Mai-Huong Tran
(74) Attorney, Agent, or Firm—Oblon, Spivak, McClelland, Maier & Neustadt, P.C.

(57) ABSTRACT

Provided are a semiconductor memory device that permits increasing the degree of integration without decreasing the capacitance of the capacitor included in a memory cell, and a method of manufacturing the particular semiconductor memory device. Specifically, provided are a semiconductor memory device, comprising a semiconductor substrate, an interlayer insulating film formed on the semiconductor substrate, a first electrode formed on the interlayer insulating film, a first ferroelectric film formed on the first electrode, a second electrode formed on the first ferroelectric film, a second ferroelectric film formed on the second electrode, and a third electrode formed on the second ferroelectric film, and a method of manufacturing the particular semiconductor memory device.

18 Claims, 20 Drawing Sheets

US 6,680,499 B2

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 2000-352265, filed Nov. 20, 2000; and No. 2001-341392, filed Nov. 7, 2001, the entire contents of both of which are incorporated herein by reference.

BACKGROUND OF THE INVENTION

1. Field of the Invention

The present invention relates to a semiconductor device having a ferroelectric capacitor, particularly, to a semiconductor device having a highly integrated ferroelectric memory cell and a method of manufacturing the same.

2. Description of the Related Art

In recent years, a ferroelectric memory cell is being developed as a non-volatile semiconductor memory device having a low power consumption and a high reliability. For example, a conventional ferroelectric memory device using a ferroelectric capacitor comprising a PZT ($PbZr_{1-x}TiO_x$) film is constructed as shown in FIG. 1.

As shown in the drawing, diffusion layers 101 to 103 are formed in a semiconductor substrate 100, and gates 104 to 107 are formed on the semiconductor substrate 100 adjacent to these diffusion layers 101 to 103. A plug 108 for connecting the diffusion layer 101 to a lower electrode 111 of a ferroelectric capacitor is formed on the diffusion layer 101. Likewise, a plug 109 for connecting the diffusion layer 102 to a wiring 121 is formed on the diffusion layer 102. Further, a plug 110 for connecting the diffusion layer 103 to a lower electrode 117 of a ferroelectric capacitor is formed on the diffusion layer 103.

The lower electrode 111 common to two adjacent ferroelectric capacitors is formed above the gate 104, the diffusion layer 101 and the gate 105. One ferroelectric capacitor including a ferroelectric film 112 and an upper electrode 113 and another ferroelectric capacitor including a ferroelectric film 114 and an upper electrode 115 are formed on the lower electrode 111. The ferroelectric capacitor including the ferroelectric film 112 and the upper electrode 113 is positioned above the gate 104. On the other hand, the ferroelectric capacitor including the ferroelectric film 114 and the upper electrode 115 is positioned above the gate 105.

Similarly, a lower electrode 117 common to two adjacent ferroelectric capacitors is formed above the gate 106, the diffusion layer 103 and the gate 107. One ferroelectric capacitor including a ferroelectric film 118 and an upper electrode 119 and another ferroelectric capacitor including a ferroelectric film 122 and an upper electrode 123 are formed on the lower electrode 117. The ferroelectric capacitor including the ferroelectric film 118 and the upper electrode 119 is positioned above the gate 106. On the other hand, the ferroelectric capacitor including the ferroelectric film 122 and the upper electrode 123 is positioned above the gate 107.

The upper electrode 115 and the upper electrode 119 are connected to the wiring 121 via plugs 116 and 120, respectively. Further, the wiring 121 is connected to the diffusion layer 102 through a plug 109.

As described above, in the conventional semiconductor memory device comprising ferroelectric capacitors, a ferroelectric capacitor comprising a ferroelectric film formed between a pair of the upper electrode and the lower electrode is formed on the memory cell transistor in a 1:1 relationship. Incidentally, in the semiconductor memory device comprising a ferroelectric capacitor, the similar structure is repeated in the left-right direction in FIG. 1, through the repeated structure is not shown in FIG. 1.

In the prior art shown in FIG. 1, a plurality of unit cells each comprising a single ferroelectric capacitor connected in parallel to a single memory cell transistor are connected in series. The particular construction is described in, for example, Jpn. Pat. Appln. KOKAI Publication No. 10-255483 as a ladder-type ferroelectric memory.

The conventional ladder-type ferroelectric memory disclosed in the literature quoted above attracts attentions in that a ferroelectric memory comprising a plurality of unit cells that are connected in series, each unit cell being constructed such that both ends of a capacitor (C) are connected between the source and drain of a memory cell transistor (T), said ferroelectric memory being hereinafter referred to as the "series connected TC-parallel unit ferroelectric memory", is adapted for achieving a high degree of integration.

In the conventional ferroelectric capacitor, however, it is possible for the damage in the manufacturing process to produce a prominent influence with reduction in the capacitor size so as to deteriorate the capacitor characteristics. Particularly, in forming a capacitor by utilizing a reactive ion etching (RIE), it is necessary to ensure an alignment margin in view of the possibility of the over-etching of the side surface of the capacitor and in view of the deviation in the alignment of the mask. As a result, the shape of the capacitor obtained after the etching is rendered smaller than the design value, leading to the possibility that it is impossible to obtain a required capacitance.

It should also be noted that, since the ferroelectric film of the ferroelectric capacitor is formed of a single layer, the processing of the capacitor is rendered difficult and the capacitor tends to incur the damage on the process, if the size of the ferroelectric capacitor is reduced in accordance with reduction in the chip size of the semiconductor memory device. As a result, a problem is generated that the electrical characteristics, the reliability and the manufacturing yield of the semiconductor memory device are adversely affected. The present invention, which has been achieved in an attempt to overcome the above-noted problems, is intended to provide a semiconductor memory device that permits enhancing the degree of integration without decreasing the capacitance of the memory cell capacitor and to provide a method of manufacturing the particular semiconductor memory device.

BRIEF SUMMARY OF THE INVENTION

According to an aspect of the present invention, there is provided a semiconductor memory device, comprising a semiconductor substrate, an interlayer insulating film formed on the semiconductor substrate, a first electrode formed on the interlayer insulating film, a first ferroelectric film formed on the first electrode, a second electrode formed on the first ferroelectric film, a second ferroelectric film formed on the second electrode, and a third electrode formed on the second ferroelectric film.

According to another aspect of the present invention, there is provided a semiconductor memory device, comprising a semiconductor substrate, a first transistor formed on the semiconductor substrate and having a gate, a source formed of a first diffusion layer and a drain formed of a second diffusion layer, the first and second diffusion layers being arranged to face each other with the gate interposed therebetween, a second transistor formed on the semiconductor substrate, positioned adjacent to the first transistor, and having a gate, a source formed of a third diffusion layer and a drain formed of a fourth diffusion layer, the third and fourth diffusion layers being arranged to face each other with the gate interposed therebetween, a first plug electrode connected to the first diffusion layer, a second plug electrode connected to the second diffusion layer, a third plug electrode connected to the third diffusion layer, a fourth plug electrode connected to the fourth diffusion layer, a first bit line connected to the second plug electrode, a second bit line connected to the fourth plug electrode, a first electrode connected to the first diffusion layer through the first plug electrode, a first ferroelectric film formed on the first electrode, a second electrode formed on the first ferroelectric film, a second ferroelectric film formed on the second electrode, a third electrode formed on the second ferroelectric film, and a wiring connected to each of the third electrode and the third diffusion layer.

According to another aspect of the present invention, there is provided a semiconductor memory device, comprising a semiconductor substrate; a first transistor formed on the semiconductor substrate and having a gate, a source formed of a first diffusion layer, and a drain formed of a second diffusion layer, the first and second diffusion layers being arranged to face each other with the gate interposed therebetween; a second transistor formed on the semiconductor substrate, positioned adjacent to the first transistor, and having a gate, and a drain formed of a third diffusion layer arranged to face the first diffusion layer with the gate interposed therebetween, the first and second transistors sharing the source formed of the first diffusion layer; a first plug electrode connected to the first diffusion layer; a second plug electrode connected to the second diffusion layer; a third plug electrode positioned apart from the first plug electrode and connected to the first diffusion layer; a bit line connected to the second plug electrode; a first electrode connected to the first diffusion layer through the first plug electrode; a first ferroelectric film formed on the first electrode; a second electrode formed on the first ferroelectric film; a second ferroelectric film formed on the second electrode; a third electrode formed on the second ferroelectric film; and a wiring connected to each of the third electrode and the first diffusion layer through the third plug electrode.

According to another aspect of the present invention, there is provided a semiconductor memory device, comprising a semiconductor substrate; a transistor formed on the semiconductor substrate and having a gate, a source formed of a first diffusion layer and a drain formed of a second diffusion layer, the first and second diffusion layers being arranged to face each other with the gate interposed therebetween; a first plug electrode connected to the first diffusion layer; a second plug electrode connected to the second diffusion layer; a third plug electrode positioned apart from the first plug electrode and connected to the first diffusion layer; a bit line connected to the second plug electrode; a first electrode connected to the first diffusion layer through the first plug electrode; a first ferroelectric film formed on the first electrode; a second electrode formed on the first ferroelectric film; a second ferroelectric film formed on the second electrode; a third electrode formed on the second ferroelectric film; and a wiring connected to the third electrode and to the first diffusion layer through the third plug electrode.

According to another aspect of the present invention, there is provided a method of manufacturing a semiconductor memory device, comprising forming a first diffusion layer on a semiconductor substrate and a second diffusion layer on the semiconductor substrate at a position a predetermined distance apart from the first diffusion layer; forming a first insulating film on the semiconductor substrate; forming a first plug electrode connected to the first diffusion layer in the first insulating film; forming a second plug electrode connected to the second diffusion layer in the first insulating film; forming a first electrode layer connected to the first diffusion layer through the first plug electrode above the semiconductor substrate; forming a first electrode by processing the first electrode layer in a predetermined shape; forming a first ferroelectric film on the first electrode; forming a second electrode layer on the first ferroelectric film; forming a second ferroelectric film on the second electrode layer; forming a third electrode layer on the second ferroelectric film; processing the second ferroelectric film and the third electrode layer in a predetermined shape; processing the second electrode layer in a predetermined shape; forming a second insulating film on the first ferroelectric film; forming a third plug electrode connected to the third electrode in the second insulating film; forming a fourth plug electrode connected to the second plug electrode in the second insulating film; and forming a wiring connected to each of the third plug electrode and the fourth plug electrode on the second insulating film.

Further, according to still another aspect of the present invention, there is provided a method of manufacturing a semiconductor memory device, comprising forming on a semiconductor substrate a first diffusion layer, a second diffusion layer a predetermined distance apart from the first diffusion layer, and a third diffusion layer a predetermined distance apart from the second diffusion layer; forming a first insulating film on the semiconductor substrate; forming a first plug electrode connected to the first diffusion layer in the first insulating film; forming a second plug electrode connected to the second diffusion layer in the first insulating film; forming a third plug electrode connected to the third diffusion layer in the first insulating film; forming a first electrode layer connected to the first diffusion layer through the first plug electrode above the semiconductor substrate; forming a first electrode by processing the first electrode layer in a predetermined shape; forming a first ferroelectric film on the first electrode; forming a second electrode layer on the first ferroelectric film; forming a second ferroelectric film on the second electrode layer; forming a third electrode layer on the second ferroelectric film; processing the third ferroelectric film and the third electrode layer in a predetermined shape; processing the second electrode layer in a predetermined shape; forming a second insulating film on the first ferroelectric film; forming a fourth plug electrode connected to the third electrode in the second insulating film; forming a fifth plug electrode connected to each of the second plug electrode and the second electrode in the second insulating film; forming a sixth plug electrode connected to the third plug electrode in the second insulating film; and forming a wiring connected to each of the sixth plug electrode and the fourth plug electrode on the second insulating film.

DETAILED DESCRIPTION OF THE INVENTION

Figure 1:
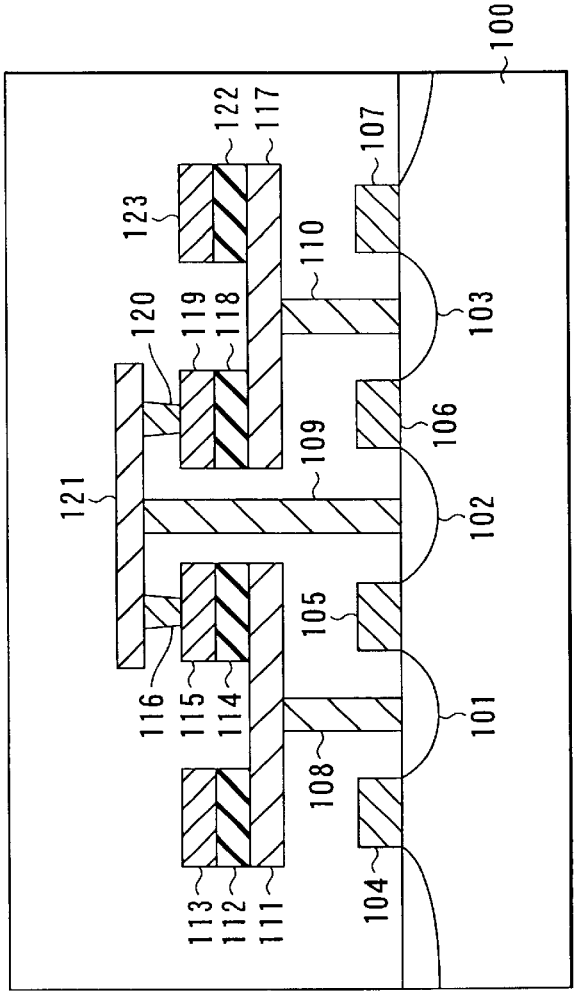
FIG. 1 is a cross sectional view showing the construction of a conventional ferroelectric memory.

Some embodiments of the present invention will now be described with reference to the accompanying drawings. Throughout the accompanying drawings, the same or similar portions are denoted by the same or similar reference numerals. The drawings schematically show the construction of the semiconductor device and, thus, the relationship between the thickness and the planar dimension, the ratio of the thicknesses of the various layers, etc. differ from those of the actual semiconductor device. The specific thickness and the dimension of each of the constituents of the semiconductor device should be construed in view of the following description. Also, some of the accompanying drawings differ from each other in the dimensional relationship and the ratio of the constituents of the semiconductor device.

<First Embodiment>

A first embodiment of the present invention will now be described with reference to FIGS. 2 to 6. In the first embodiment of the present invention, laminated ferroelectric capacitors according to the present invention are used in a 1T1C type (1 transistor-1 capacitor type) ferroelectric memory.

In the 1T1C type ferroelectric memory, the electrodes on one side of a plurality of capacitors are connected to the same plate line, and the other electrodes of these plural capacitors are connected to the sources of memory cell transistors arranged to correspond to these plural capacitors in the 1:1 relationship. The drains of the memory cell transistors are connected to different bit lines, and the gate of these memory cell transistors are connected to the same word line.

In the first embodiment of the present invention, two ferroelectric capacitors are arranged in parallel between the source of each of the memory cell transistors and the plate line and, thus, the semiconductor device of the first embodiment has a capacitance two times as large as the capacitance of the conventional semiconductor memory device constructed such that only one capacitor is connected to each of the memory cell transistors.

Figure 2:
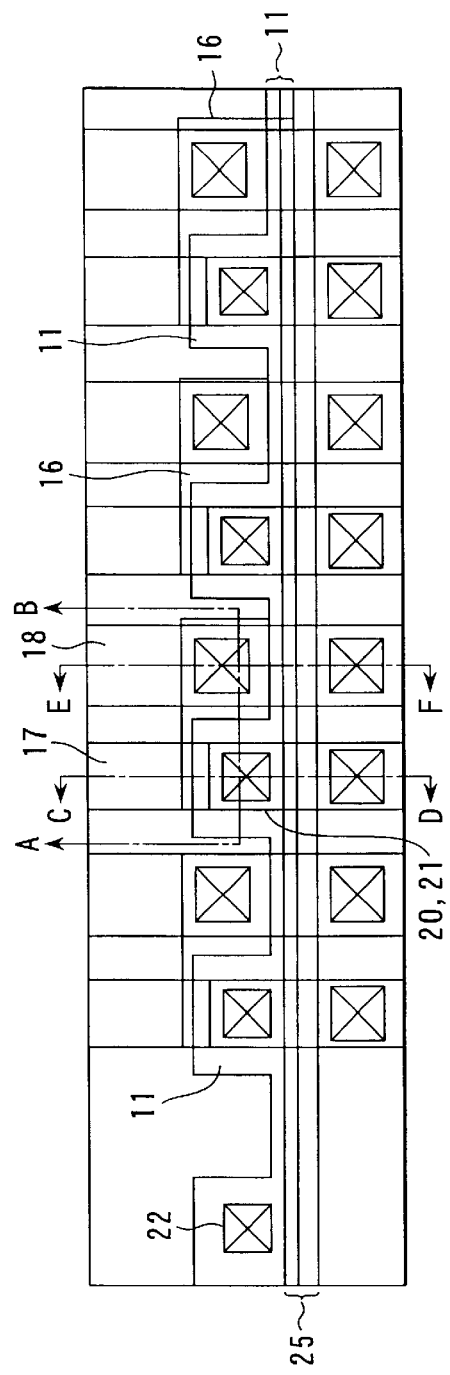
FIG. 2 is a plan view showing the memory cell according to a first embodiment of the present invention.

FIG. 2 is a plan view showing a semiconductor memory device according to the first embodiment of the present invention, which includes a ferroelectric capacitor. Shown in the central portion of FIG. 2 are first and second memory cell transistors having the drains connected to bit lines 17, 18, respectively, a word line (gate) 25 commonly connected to the gates of the first and second memory cell transistors, a first ferroelectric capacitor 20 formed below a plate line 11 used as an electrode, a second ferroelectric capacitor 21 laminated on the first ferroelectric capacitor 20 and formed with the plate line 11 used commonly as an electrode, and a wiring 16 for connecting the upper electrode of the second ferroelectric capacitor to the source of the second memory cell transistor.

The lower electrode of the first ferroelectric capacitor is connected to the source of the first memory cell transistor, and the plate line 16 is connected to a plate contact diffusion layer (not shown) formed in the semiconductor substrate via a plate line contact 22. The word line 25 and the plate line 11 are formed to extend in the left-right direction in FIG. 2, and a plurality of bit lines 17, 18, etc. are arranged to cross the word line 25 at right angles. Further, the plate line 16 is enlarged in that region which is used as the common electrode of the first and second ferroelectric capacitors 20, 21, and the structure described above is repeated in the left-right direction in FIG. 2 so as to form the semiconductor memory device according to the first embodiment of the present invention.

Figure 3:
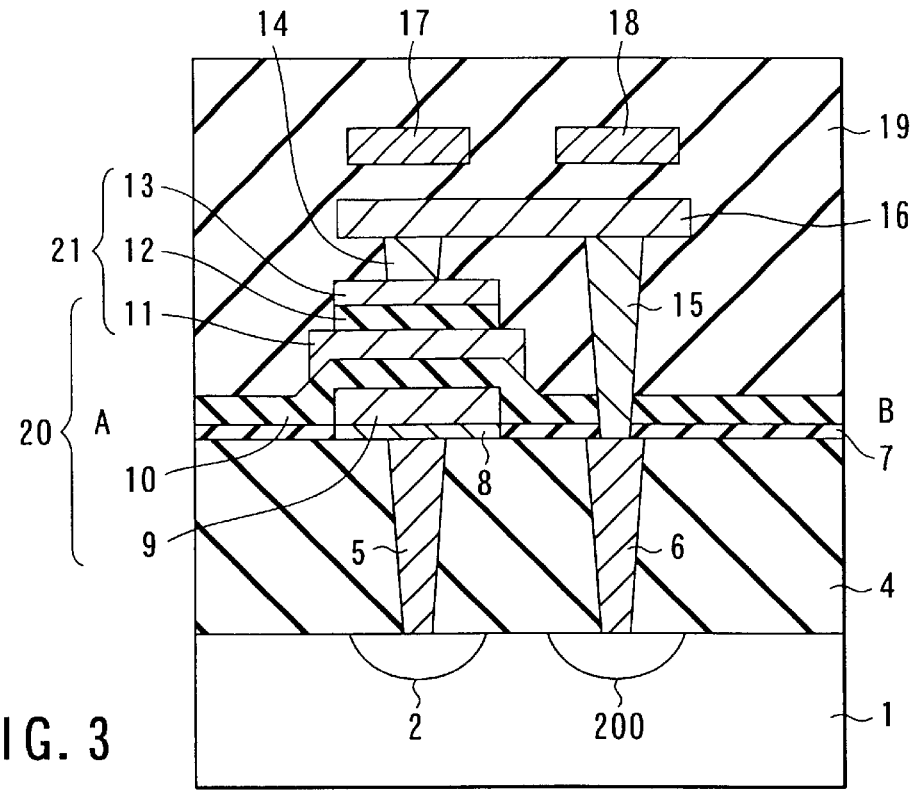
FIG. 3 is a cross sectional view along the line A-B shown in FIG. 2.

The construction of the semiconductor memory device according to the first embodiment of the present invention will now be described more in detail with reference to the cross sectional views along the lines A-B, C-D and E-F shown in FIG. 2. FIG. 3 is a cross sectional view along the line A-B shown in FIG. 2.

As shown in FIG. 3, a source diffusion layer 2 of a first memory cell transistor and a source diffusion layer 200 of a second memory cell transistor are formed in a semiconductor substrate 1. The source diffusion layer 200 is formed a predetermined distance apart from the diffusion layer 2. Also, a first interlayer insulating film 4 is formed on the semiconductor substrate 1. A plug 5 electrically connected to the source diffusion layer 2 and a plug 6 electrically connected to the source diffusion layer 200 are formed in the first interlayer insulating film 4.

A reaction protecting film 7 for a ferroelectric film is formed on the first interlayer insulating film 4. The reaction protecting film 7 for a ferroelectric film is formed of a laminate film including, for example, a silicon nitride (SiN) film and an alumina ($Al_2O_3$) film or a titanium oxide film. Further, a protective film 8 is formed on the plug 5. The protective film 8 is formed of a laminate film including, for example, a TiAlN film and an $IrO_x$ film.

A lower electrode 9 of a first ferroelectric capacitor is formed on the protective film 8, and a ferroelectric film 10 of a first ferroelectric capacitor 20 is formed over the entire regions of the protective film 8 and the lower electrode 9. Further, a plate line 11 forming the upper electrode of the first ferroelectric capacitor 20 is formed on the ferroelectric film 10.

Only the enlarged portion shown in FIG. 2 of the plate line 11 is shown in the cross sectional view along the line A-B shown in FIG. 3. However, the plate line 11 is formed longer than the lower electrode 9 in the direction of the line A-B along the word line 25 shown in FIG. 2. A ferroelectric film 12 of the second ferroelectric capacitor 21 is formed on the plate line 11. The ferroelectric film 12 is formed shorter than the plate line 11 in the direction of the line A-B. An upper electrode 13 of the second ferroelectric capacitor 21 and a plug 14 are formed on the ferroelectric film 12.

A plug 15 electrically connected to the plug 6 through the reaction protecting film 7 for the ferroelectric film, the ferroelectric film 10 and the second interlayer insulating film 19 is formed on the plug 6 of the source diffusion layer 200. The plug 14 and the plug 15 are connected to each other via a wiring 16. A first bit line 17 is formed above the plug electrode 5, and a second bit line 18 is formed above the plug electrode 6. Incidentally, a second interlayer insulating film is formed on the entire surface so as to cover the upper structure of the ferroelectric film 10.

As described above, the second capacitor 21 comprising the plate line 11, the ferroelectric film 12 and the upper electrode 13 is stacked on the first capacitor 20 comprising the lower electrode 9, the ferroelectric film 10 and the plate line 11. Incidentally, in the cross sectional view showing the construction of the first embodiment of the present invention, a plug oxidation protection film, etc., which are actually formed, are omitted.

Figure 4:
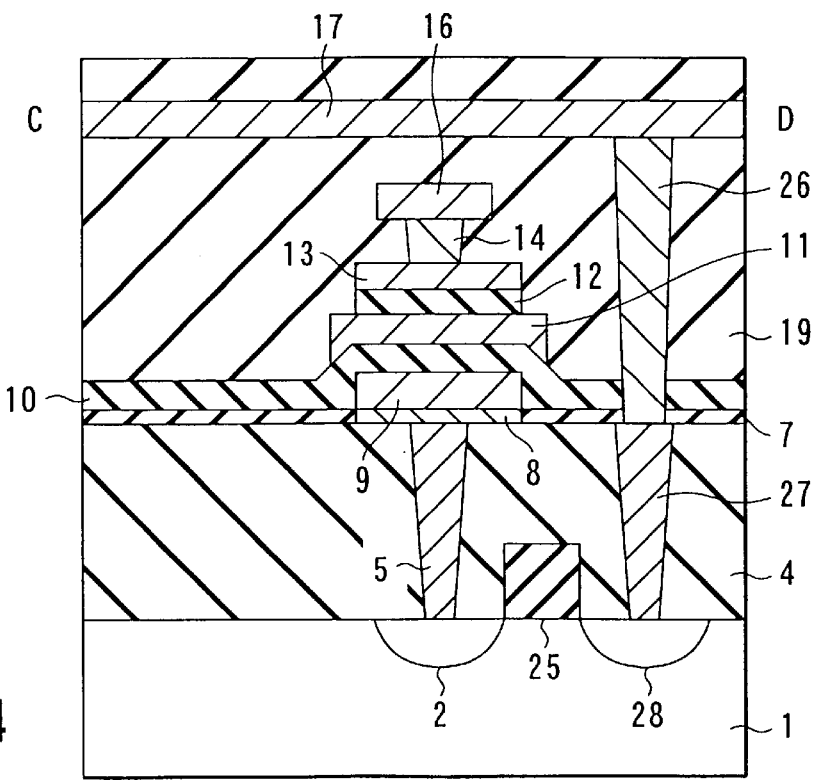
FIG. 4 is a cross sectional view along the line C-D shown in FIG. 2.

FIG. 4 is a cross sectional view along the line C-D shown in FIG. 2. In the cross sectional view along the line C-D, the word line (gate) 25 is formed below the lower electrode 9. How the wiring 16 connected to the upper electrode 13 is connected to the semiconductor substrate 1 is not shown in the cross sectional view along the line C-D. However, the first bit line 17 is arranged above the wiring 16 in a manner to extend in the left-right direction, and is connected to a drain diffusion layer 28 the first memory cell transistor through plugs 26, 27, with the result that the bit line potential is imparted to the drain diffusion layer 28 of the memory cell transistor. Incidentally, the source diffusion layer 2 of the first memory cell transistor is connected to the lower electrode 9 through the plug 5.

Figure 5:
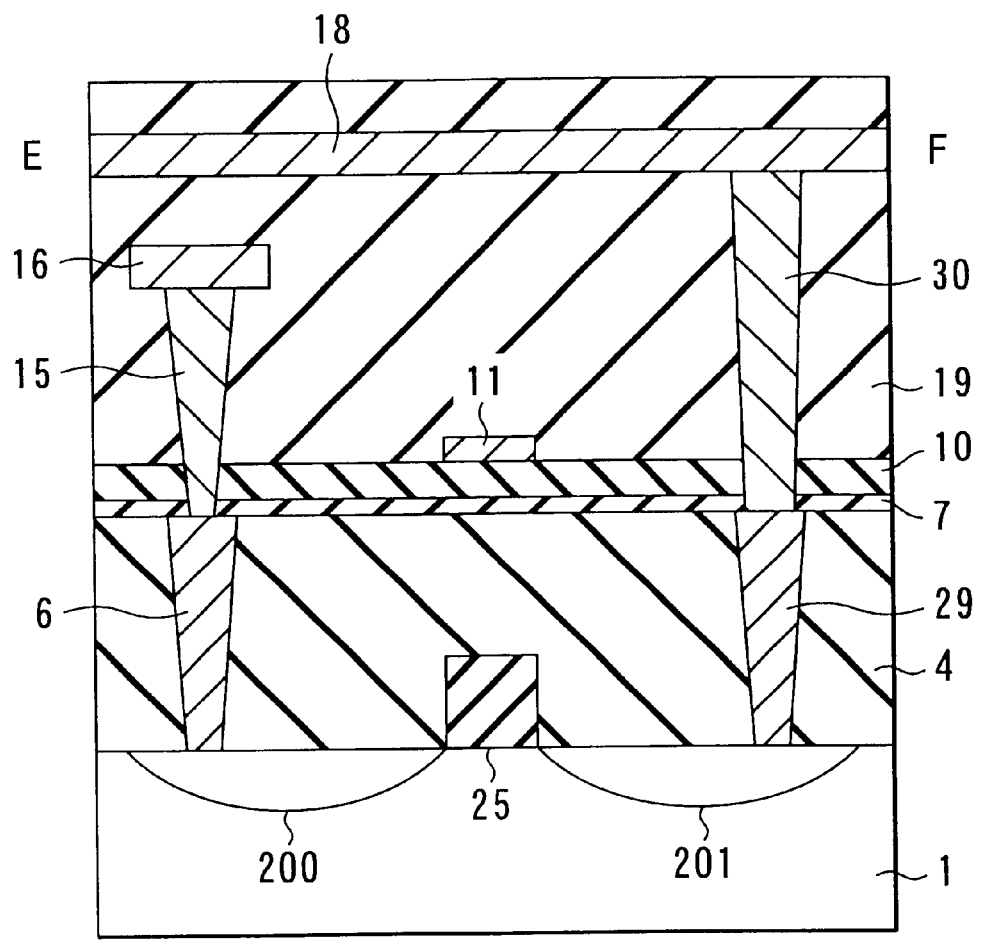
FIG. 5 is a cross sectional view along the line E-F shown in FIG. 2.

FIG. 5 is a cross sectional view along the line E-F shown in FIG. 2. The cross sectional view along the line E-F shows a cross section of the second bit line 18 positioned adjacent to and extending in parallel to the first bit line 17, and also shows how the wiring 16 is electrically connected to the source diffusion layer 200 of a second memory cell transistor through the plugs 6, 15. However, how the wiring 16 is connected to the upper electrode 13 is not shown in the cross sectional view along the line E-F shown in FIG. 2.

A drain diffusion layer 201 of the second memory cell transistor is formed on the side facing the source diffusion layer 200 with the word line 25 interposed therebetween. The drain diffusion layer 201 is electrically connected to the second bid line 18 via plugs 29, 30. Incidentally, a cross section of a thin portion of the plate line 11 is shown on the ferroelectric film 10.

Figure 6A:
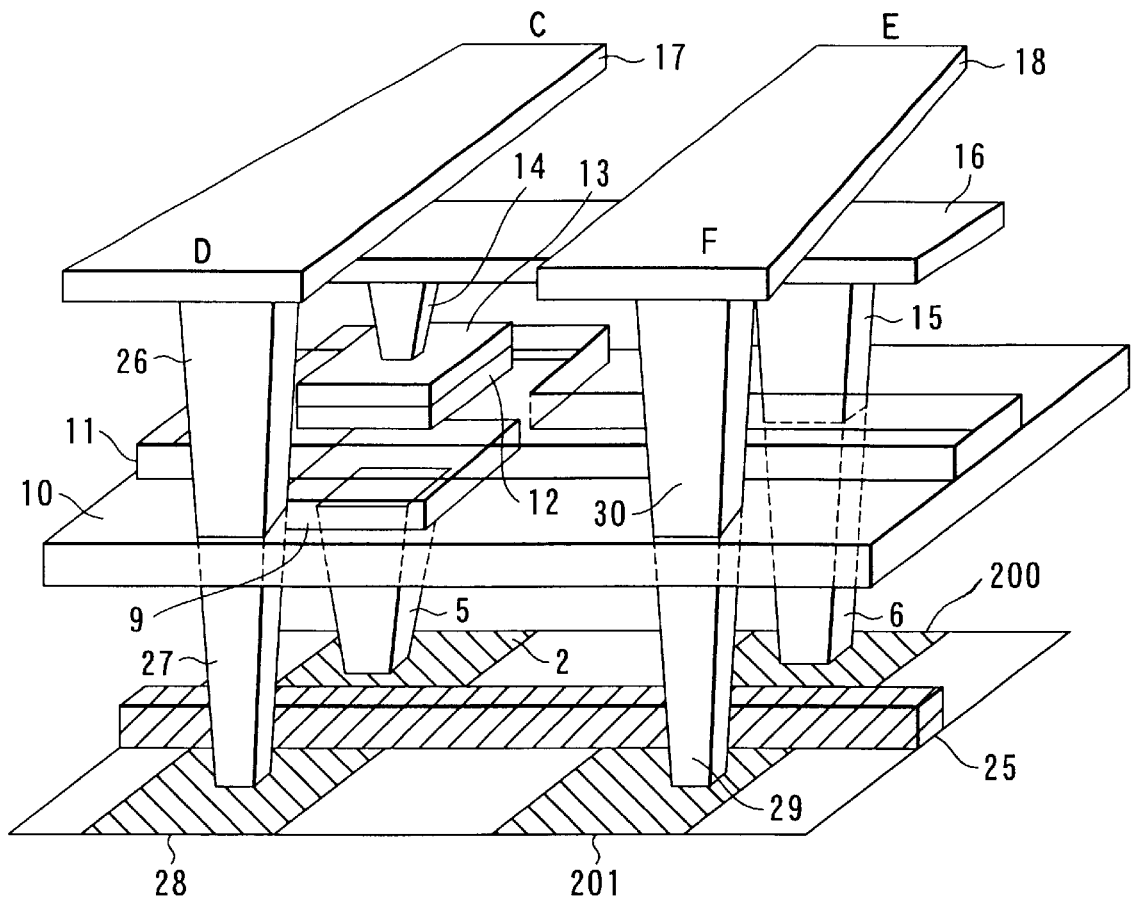
FIG. 6A is an oblique view showing the construction of the memory cell in the vicinity of the lines C-D and E-F shown in FIG. 2.
Figure 6B:
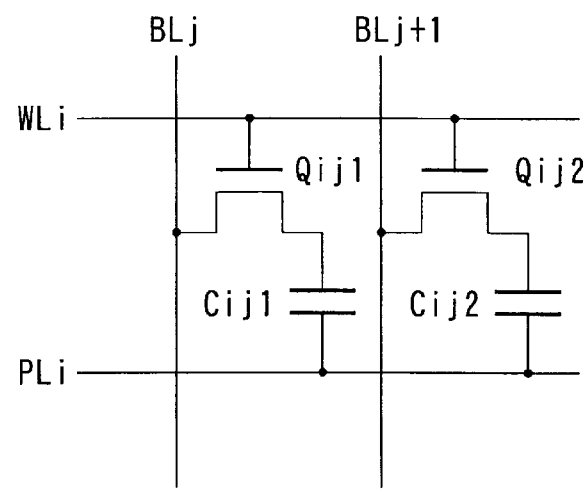
FIG. 6B is an equivalent circuit diagram of the region shown in FIG. 6A.

FIG. 6A is an oblique view showing the shape in the vicinity of the lines C-D and E-F shown in FIG. 2, and FIG. 6B is an equivalent circuit diagram of the region shown in FIG. 6A. As shown in FIG. 6A, the width of the plate line 11 is made larger in the portion where the ferroelectric capacitor is formed than in the other portion such that the area of the plate line 11 in the particular portion is made larger than the capacitor area.

As described previously, the first ferroelectric capacitor 20 is formed by using the ferroelectric film 10 positioned between the enlarged portion of the plate line 11 and the lower electrode 9, and the second ferroelectric capacitor 20 utilizing the ferroelectric film 12 interposed between the enlarged portion of the plate line 11 and the upper electrode 13 is stacked on the first ferroelectric capacitor 20.

How the first and second memory cell transistors shown in FIG. 6A are connected to the first and second ferroelectric capacitors will now be described in detail with reference to the equivalent circuit diagram shown in FIG. 6B. Bit lines BLj and BLj+1 shown in FIG. 6B correspond to the first and second bit lines 17 and 18, respectively, a word line WLi shown in FIG. 6B corresponds to the word line 25, and a plate line PLi shown in FIG. 6B corresponds to the plate line 11. The letters i, j shown above represent natural numbers.

A transistor Qij1 shown in FIG. 6B corresponds to the first memory cell transistor having the drain diffusion layer 28 connected to the first bit line 17, and a transistor Qij2 corresponds to the second memory cell transistor having the drain diffusion layer 201 connected to the second bit line 18. A capacitor Cij1 shown in FIG. 6B corresponds to the first ferroelectric capacitor 20 formed below the enlarged portion of the plate line 11, and a capacitor Cij2 corresponds to the second ferroelectric capacitor 21 formed above the enlarged portion of the plate line 11.

As apparent from the comparison between FIGS. 6A and 6B, in the first memory cell transistor positioned on the left side of FIG. 6A, the lower electrode 9 is electrically connected to the source diffusion layer 2 through the plug 5 so as to exchange the stored data with the first bit line 17 connected to the drain diffusion layer 28. Also, in the second memory cell transistor positioned on the right side in FIG. 6A, the upper electrode 13 is electrically connected to the source diffusion region 200 via the plug 6, the plug 15, the wiring 16 and the plug 14 so as to exchange the stored data with the second bit line 18 connected to the drain diffusion layer 201.

The equivalent circuit diagram given in FIG. 6B shows that the electrodes of the capacitors Cij1 and Cij2 on one side are commonly connected to the plate line PLi. However, attentions should be paid to the structure shown in the oblique view given in FIG. 6B that the first and second ferroelectric capacitors are connected to each other in a three dimensional direction in a manner to be laminated one upon the other in the vertical direction with the enlarged portion of the plate line 11 used as the common electrode.

It should be noted that the thickness of each of the ferroelectric films 10 and 12 falls within a range of between 0.1 $\mu$m and 0.3 $\mu$m, that the thickness of each of the lower electrode 9, the plate line 11 and the upper electrode 13 falls within a range of between 0.1 $\mu$m and 0.2 $\mu$m, and that the width of the word line (gate) 25 is about 0.2 $\mu$m. The dimensions noted above are no more than an example, and it is possible to change these dimensions appropriately depending on the design and the specification.

Each of the lower electrode 9, the plate line 11 and the upper electrode 13 is formed of a laminate structure comprising a Ti film and a Pt film laminated on the Ti film. The thickness of the Pt film is, for example, 0.1 $\mu$m. It is possible for the lower electrode to be formed of a laminate structure including, for example, a Si layer or a metal layer formed below a Pt layer. It is also possible for the lower electrode to be formed of, for example, Ir, IrO$_2$, a laminate structure of, for example, Ti/TiN/Pt, SrRuO, Ru, and RuO.

The ferroelectric film is formed of, for example, a mixed crystal film of SrBiTaO, a mixed crystal film of PdZrTiO and PZT, i.e., Pb(Zr$_x$Ti$_{1-x}$O$_3$). In the case of using a PZT film, the film should be about 0.15 $\mu$m thick. It is also possible to use a mixed crystal film of BaSrTiO series as well as BaTiO$_3$, PLZT, LiNbO$_3$, K$_3$Li$_2$Nb$_5$O$_{15}$. What should be noted is that it is effective to use any of ferroelectric oxide films with ionic bonding characteristics as the material of the ferroelectric film. It is possible for the interlayer insulating film to be formed of, for example, a BPSG or TEOS film. Further, it is possible for the bit line to be formed of a metal such as Al.

As described above, in the first embodiment of the present invention, capacitors each including a ferroelectric film are stacked in two stages in a vertical direction so as to form the memory cell capacitor. The particular construction is adapted for improving the degree of integration, compared with the conventional structure in which ferroelectric capacitors are arranged on the same plane to form a single stage arrangement, so as to make it possible to decrease the spaces between the adjacent bit lines and between the adjacent word lines without decreasing the capacitance. It is also possible to increase the capacitor area without lowering the degree of integration, compared with the prior art, so as to lower the process damage to the ferroelectric capacitor.

<Second Embodiment>

A second embodiment of the present invention will now be described with reference to FIGS. 7 to 25. The second embodiment is directed to a method of manufacturing the semiconductor memory device comprising the ferroelectric capacitor described in the first embodiment. The manufacturing method will now be described step by step with reference to the cross sectional views along the line A-B shown in FIG. 2.

Figure 7:
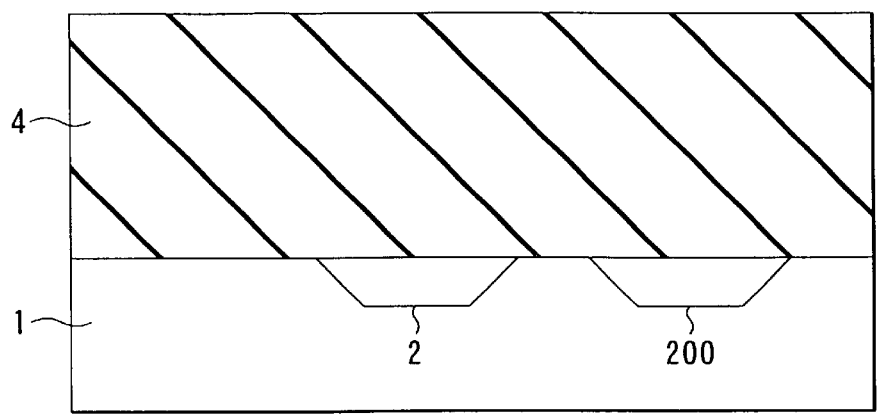
FIG. 7 is a cross sectional view showing a step of the method of manufacturing the memory cell according to a second embodiment of the present invention.

As shown in FIG. 7, formed in the first step on the silicon substrate 1 are the source diffusion layer 2 of the first memory cell transistor and the source diffusion layer 200 of the second memory cell transistor. The source diffusion layer 200 is formed a predetermined distance apart from the source diffusion layer 2. In this step, the drain diffusion layers (not shown) of the first and second memory cell transistors are formed simultaneously in the positions facing the source diffusion layers 2 and 200, respectively. Then, the first interlayer insulating film 4 made of a silicon oxide film is formed, followed by planarize the substrate surface by a chemical mechanical polishing (CMP) method.

Figure 8:
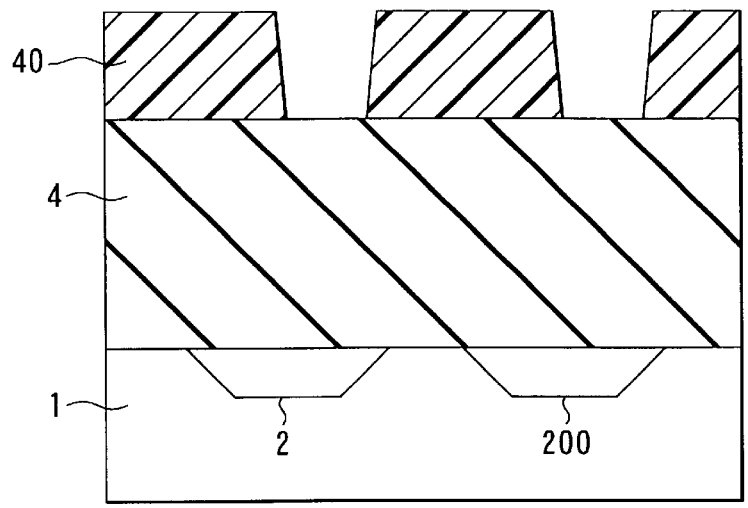
FIG. 8 is a cross sectional view showing a step, which follows the step shown in FIG. 7, of the method of manufacturing the memory cell according to the second embodiment of the present invention.
Figure 9:
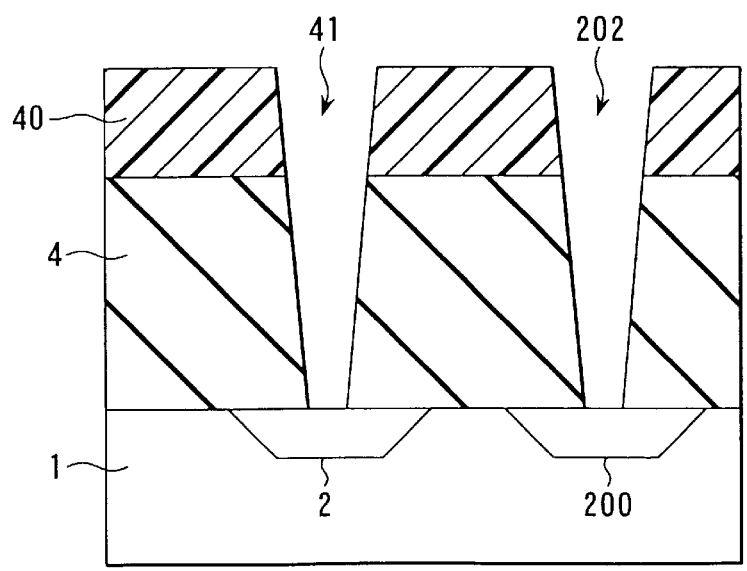
FIG. 9 is a cross sectional view showing a step, which follows the step shown in FIG. 8, of the method of manufacturing the memory cell according to the second embodiment of the present invention.

In the next step, a photoresist 40 is formed on the first interlayer insulating film 4 for forming a plug electrode, followed by applying a photolithography, hereinafter referred to as a photo engraving process (PEP), to the photoresist 40, as shown in FIG. 8. Then, contact plug windows 41, 202 for forming plug electrodes are formed above the source diffusion layers 2 and 200 of the first and second memory cell transistors by a dry etching method using the photoresist 40 used as a mask, as shown in FIG. 9, followed by removing the photoresist 40.

Figure 10:
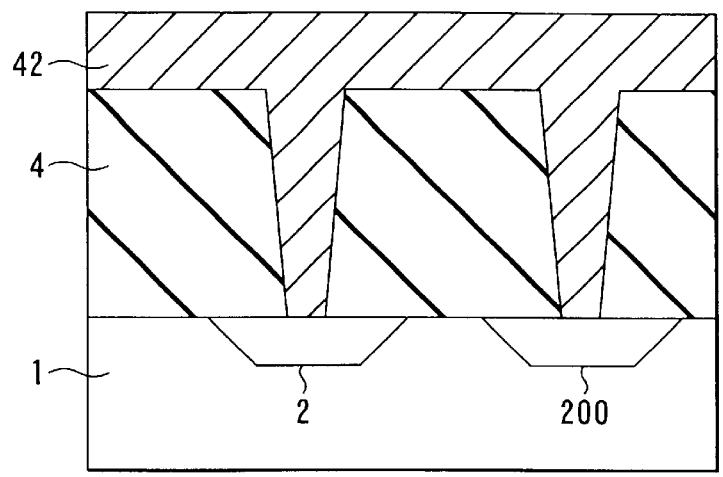
FIG. 10 is a cross sectional view showing a step, which follows the step shown in FIG. 9, of the method of manufacturing the memory cell according to the second embodiment of the present invention.
Figure 11:
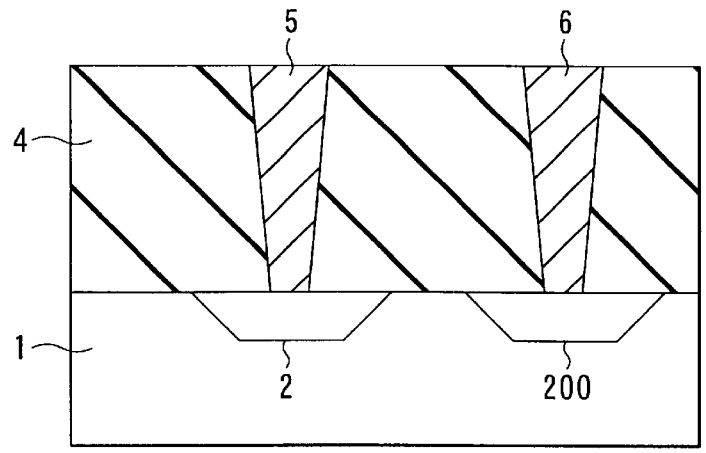
FIG. 11 is a cross sectional view showing a step, which follows the step shown in FIG. 10, of the method of manufacturing the memory cell according to the second embodiment of the present invention.

In the next step, a plug electrode material film 42 is deposited on the entire surface by a chemical vapor deposition (CVD) method, as shown in FIG. 10. Tungsten is used as the material of the plug electrode. Incidentally, it is also possible to bury a polycrystalline silicon (polysilicon) film in the contact plug windows 41, 202 in place of the metal film. After deposition of the plug electrode material film 42, the plug electrode material film 42 is planarized so as to form the plug electrodes 5 and 6 on the source diffusion layers 2 and 200, respectively, of the first and second memory cell transistors, as shown in FIG. 11.

Figure 12:
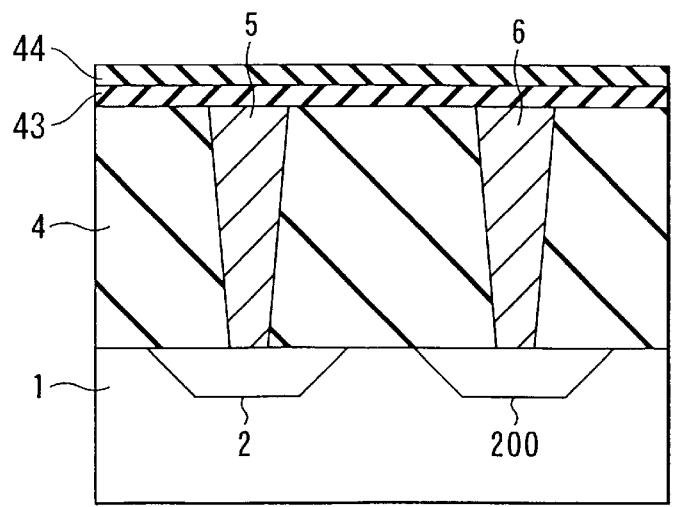
FIG. 12 is a cross sectional view showing a step, which follows the step shown in FIG. 11, of the method of manufacturing the memory cell according to the second embodiment of the present invention.

After formation of the plug electrodes 5 and 6, a silicon nitride film (SiN) is formed in a thickness of about 0.1 $\mu$m as an oxidation protective film 43 for the plug electrode on the plug electrodes 5, 6 as shown in FIG. 12, followed by depositing an alumina film ($Al_2O_3$) having a thickness of about 0.02 $\mu$m or a titanium oxide film having a thickness of about 0.02 $\mu$m as a reaction protective film 44 for the ferroelectric film on the oxidation protective film 43 for the plug electrode.

Figure 13:
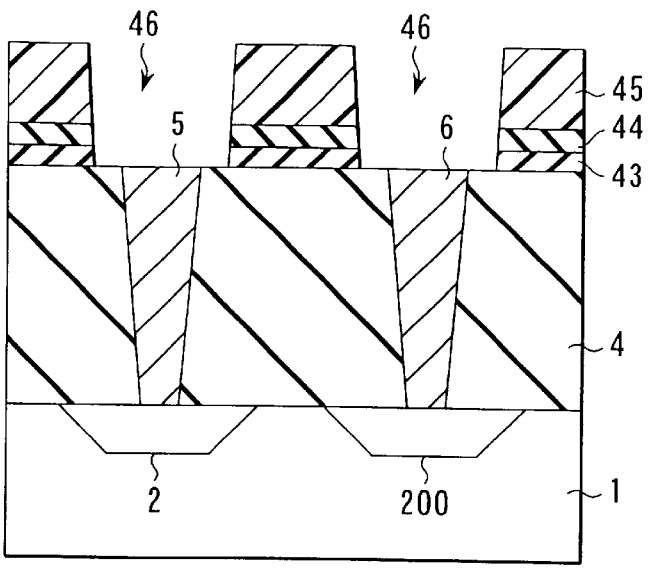
FIG. 13 is a cross sectional view showing a step, which follows the step shown in FIG. 12, of the method of manufacturing the memory cell according to the second embodiment of the present invention.
Figure 14:
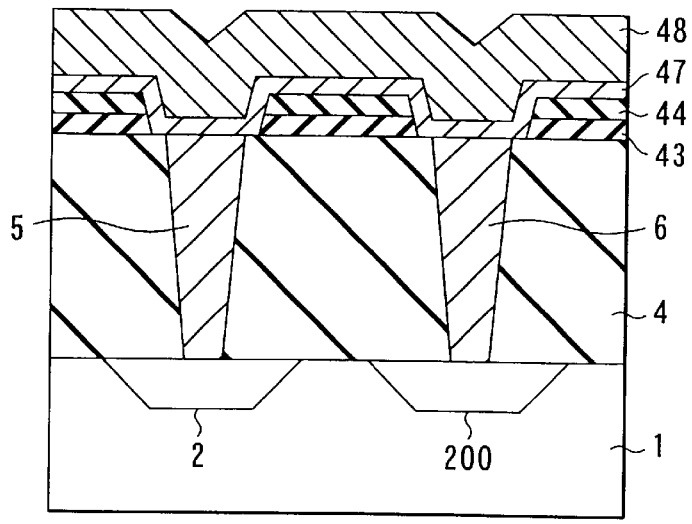
FIG. 14 is a cross sectional view showing a step, which follows the step shown in FIG. 13, of the method of manufacturing the memory cell according to the second embodiment of the present invention.

In the next step, PEP is applied by using the photoresist 45 as shown in FIG. 13 so as to remove by the dry etching the oxidation protective film 43 for the plug electrode and the reaction protective film 44 for the ferroelectric film, which are positioned on the plug electrodes 5 and 6, thereby forming contact plug windows 46. After formation of the contact plug windows 46, a TiAlN film 47 having a thickness of about 0.05 $\mu$m is deposited on the entire surface by a sputtering method, followed by depositing an $IrO_x$ film 48 having a thickness of about 0.05 $\mu$m on the TiAlN film 47 by a sputtering method, as shown in FIG. 14.

Figure 15:
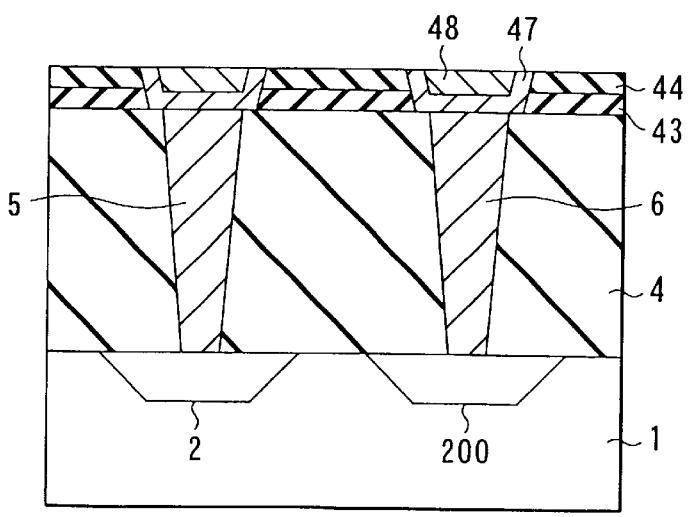
FIG. 15 is a cross sectional view showing a step, which follows the step shown in FIG. 14, of the method of manufacturing the memory cell according to the second embodiment of the present invention.
Figure 16:
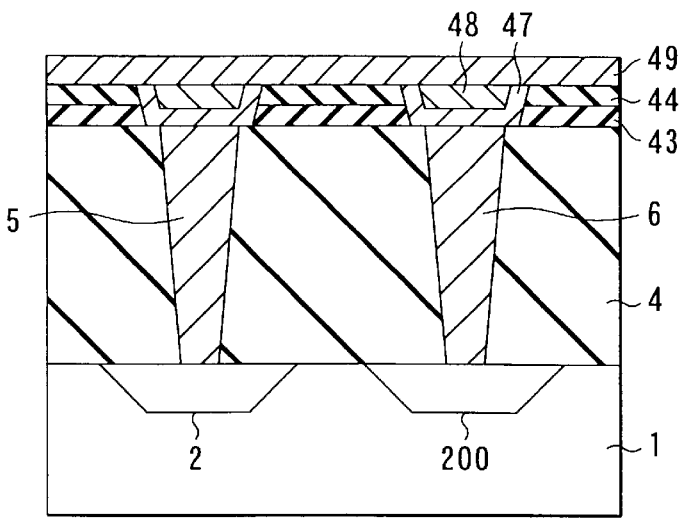
FIG. 16 is a cross sectional view showing a step, which follows the step shown in FIG. 15, of the method of manufacturing the memory cell according to the second embodiment of the present invention.
Figure 17:
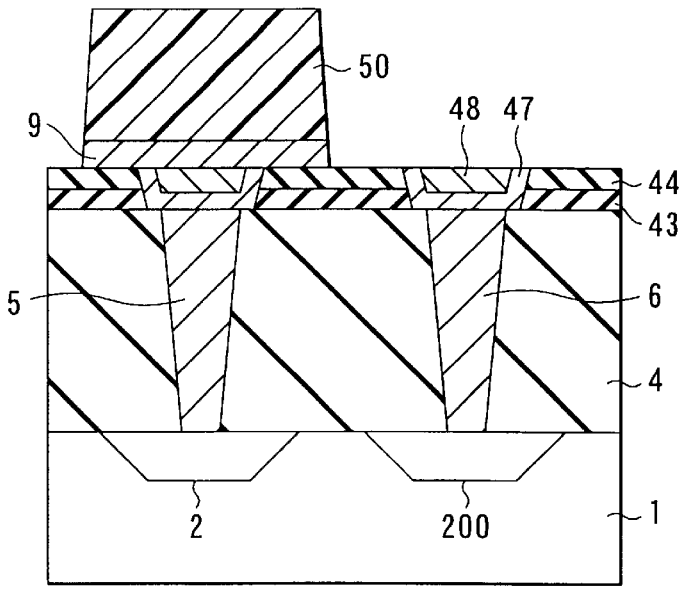
FIG. 17 is a cross sectional view showing a step, which follows the step shown in FIG. 16, of the method of manufacturing the memory cell according to the second embodiment of the present invention.
Figure 18:
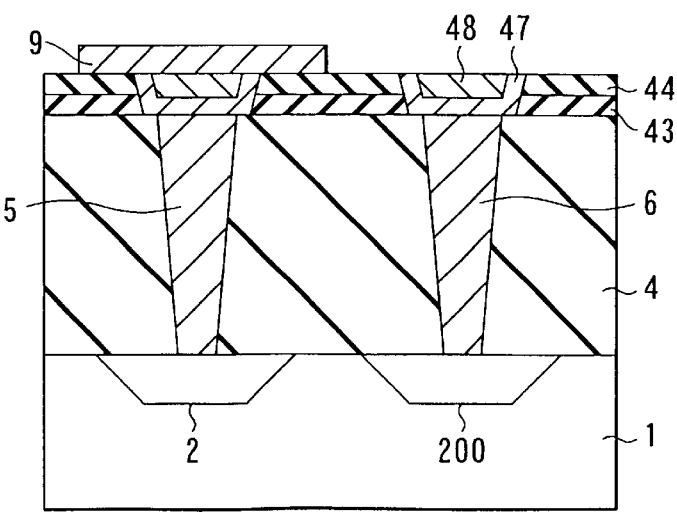
FIG. 18 is a cross sectional view showing a step, which follows the step shown in FIG. 17, of the method of manufacturing the memory cell according to the second embodiment of the present invention.

In the next step, the $IrO_x$ film 48 and the TiAlN film 47 are planarized with the oxidation protective film 43 for the plug electrode used as a stopper so as to bury the $IrO_x$ film 48 and the TiAlN film 47 in the contact plug windows 46, as shown in FIG. 15. Then, a film 49 providing the material of the lower electrode 9 of the first ferroelectric capacitor is deposited on the entire surface by a sputtering method, as shown in FIG. 16, followed by coating a photoresist film 50 and subsequently applying PEP to the photoresist film 50 so as to form the lower electrode 9 by the dry etching method and, then, removing the photoresist film 50, as shown in FIGS. 17 and 18. A Pt film is deposited in a thickness of about 0.1 $\mu$m for forming the film 49 used for forming the lower electrode 9.

Figure 19:
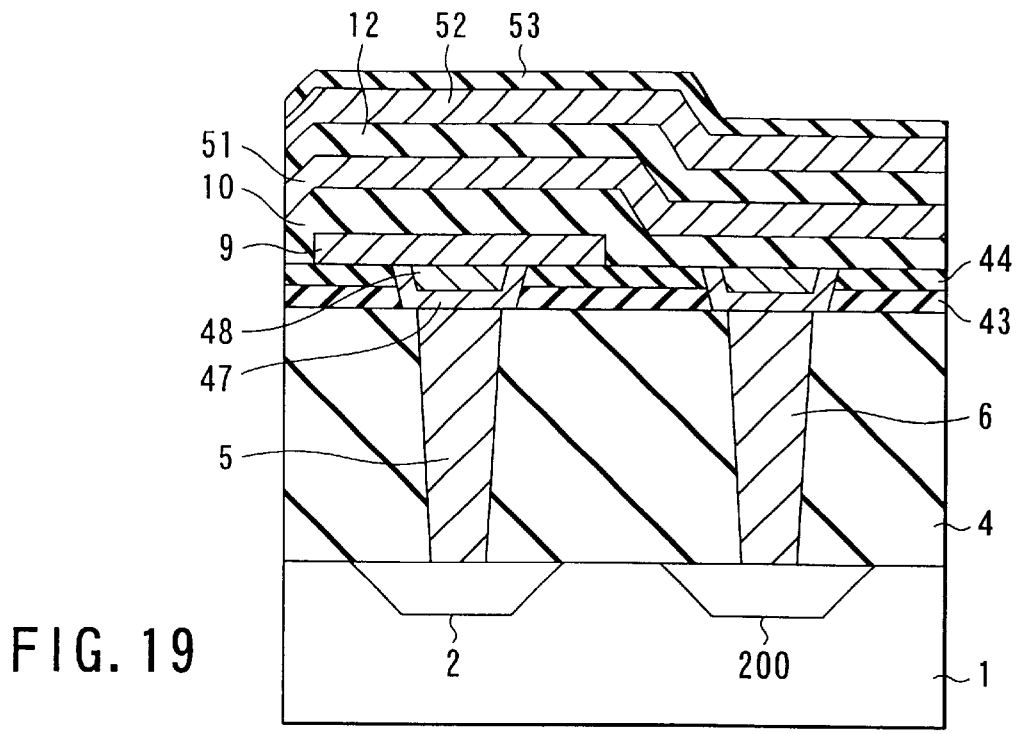
FIG. 19 is a cross sectional view showing a step, which follows the step shown in FIG. 18, of the method of manufacturing the memory cell according to the second embodiment of the present invention.

In the next step, formed successively on the entire surface are the ferroelectric film 10 of the first ferroelectric capacitor, a film 51 providing the material of the plate line 11, the ferroelectric film 12 of the second ferroelectric capacitor, a film 52 providing the material of the upper electrode 13 and a protective film 53 as shown in FIG. 19.

Each of the ferroelectric films 10 and 12 is formed of a PZT ($PbZr_{1-x}TiO_x$) film having a thickness of about 0.15 $\mu$m. Each of the film 51 providing the plate line 11 and the upper electrode 13 is formed of a Pt film having a thickness of about 0.1 $\mu$m. Further, the protective film 53 is formed of an $Al_2O_3$ film having a thickness of about 0.01 $\mu$m. After formation of each of the films noted above, a rapid thermal annealing (RTA) is applied for 30 seconds at about 650° C. under an oxygen gas atmosphere so as to crystallize each of the ferroelectric films 10, 12.

Figure 20:
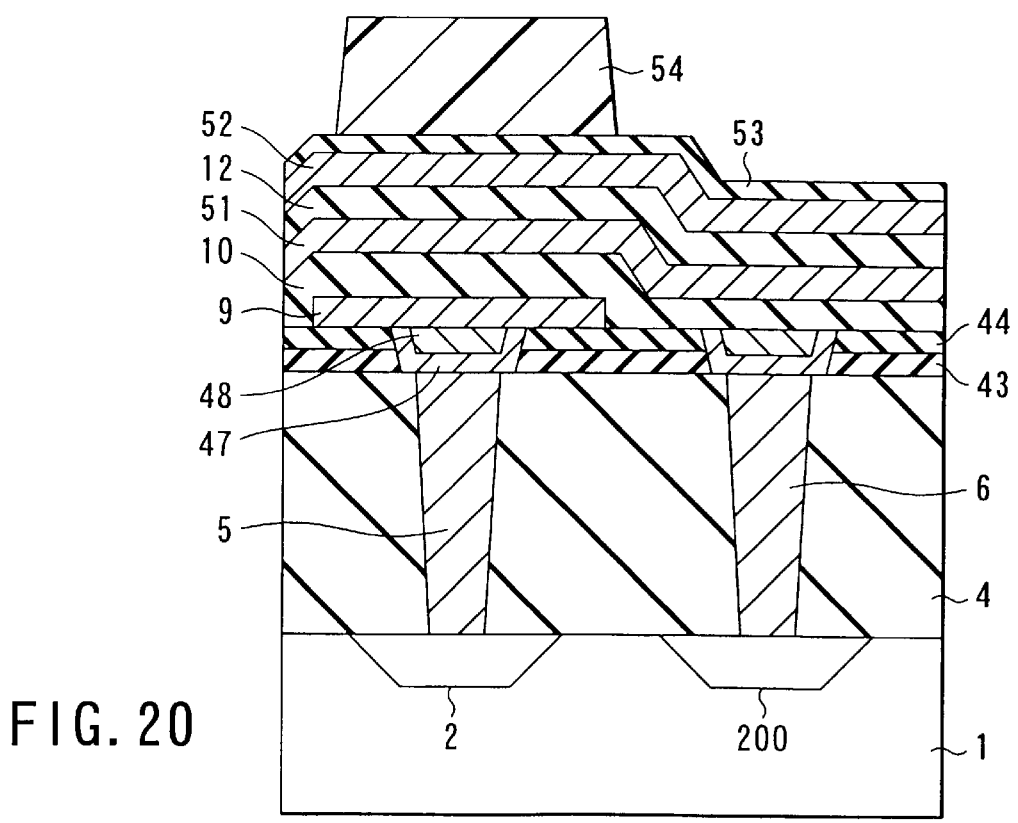
FIG. 20 is a cross sectional view showing a step, which follows the step shown in FIG. 19, of the method of manufacturing the memory cell according to the second embodiment of the present invention.
Figure 21:
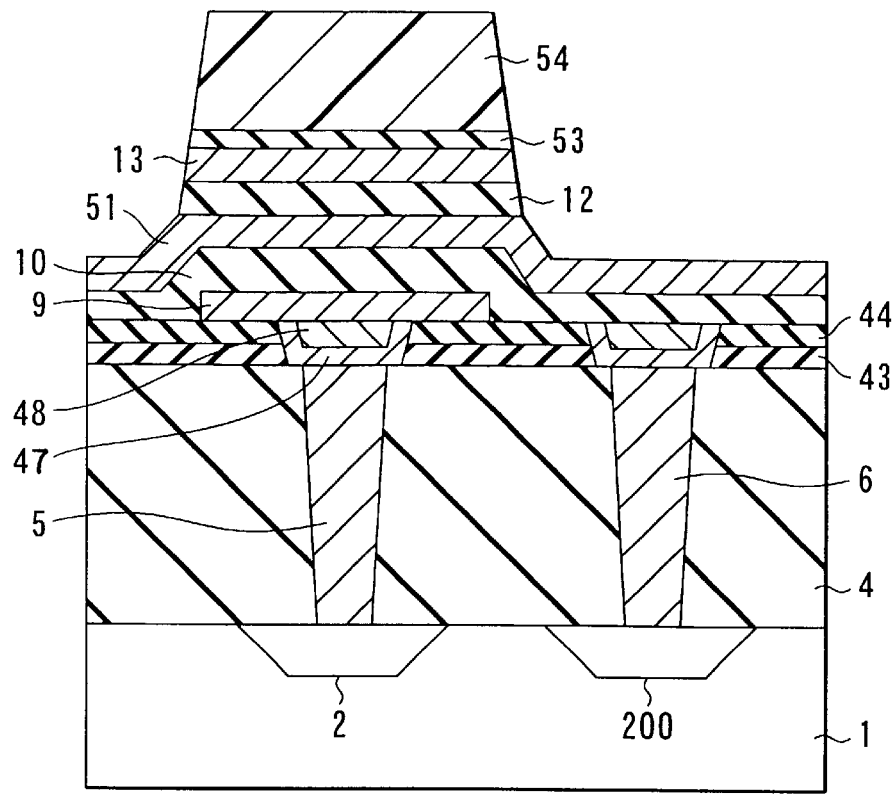
FIG. 21 is a cross sectional view showing a step, which follows the step shown in FIG. 20, of the method of manufacturing the memory cell according to the second embodiment of the present invention.
Figure 22:
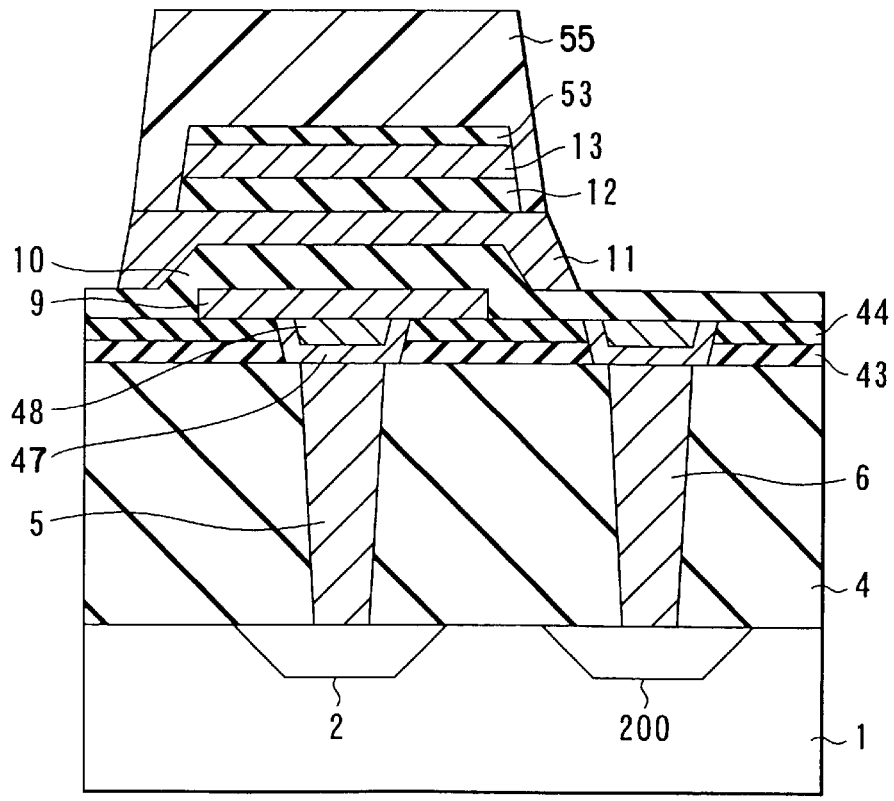
FIG. 22 is a cross sectional view showing a step, which follows the step shown in FIG. 21, of the method of manufacturing the memory cell according to the second embodiment of the present invention.

In the next step, a photoresist 54 is formed on the protective film 53 above the lower electrode 9 as shown in FIG. 20, followed by applying PEP so as to process the protective film 53, the film 52 providing the material of the upper electrode 13 and the ferroelectric film 12 of the first ferroelectric capacitor by the dry etching as shown in FIG. 21. Then, PEP is applied by forming a photoresist 55 so as to process the material film 51 shown in FIG. 21, thereby forming the plate line 11, as shown in FIG. 22.

Figure 23:
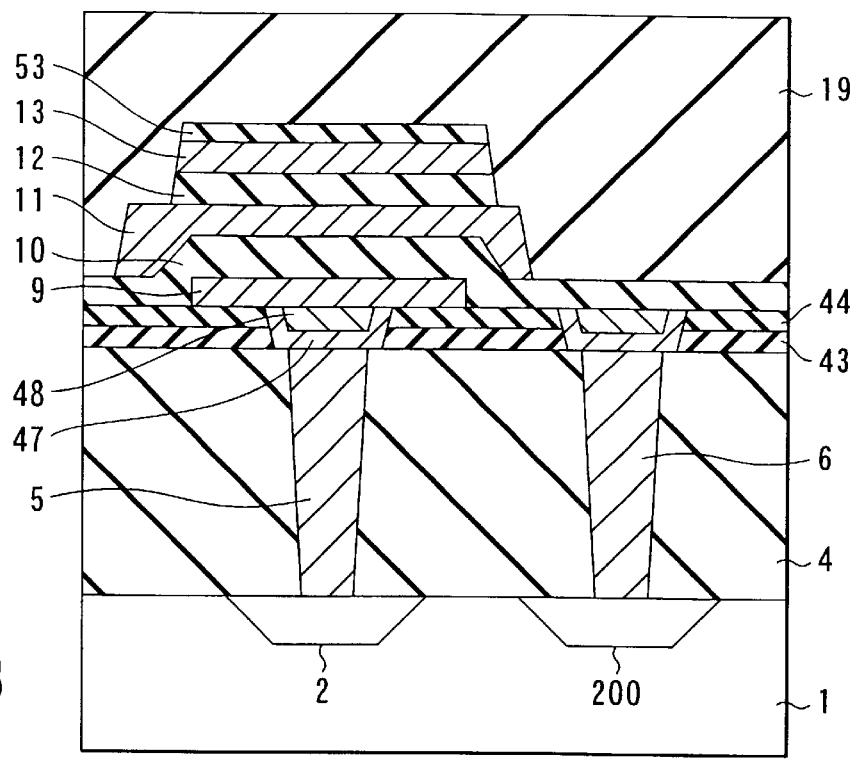
FIG. 23 is a cross sectional view showing a step, which follows the step shown in FIG. 22, of the method of manufacturing the memory cell according to the second embodiment of the present invention.
Figure 24:
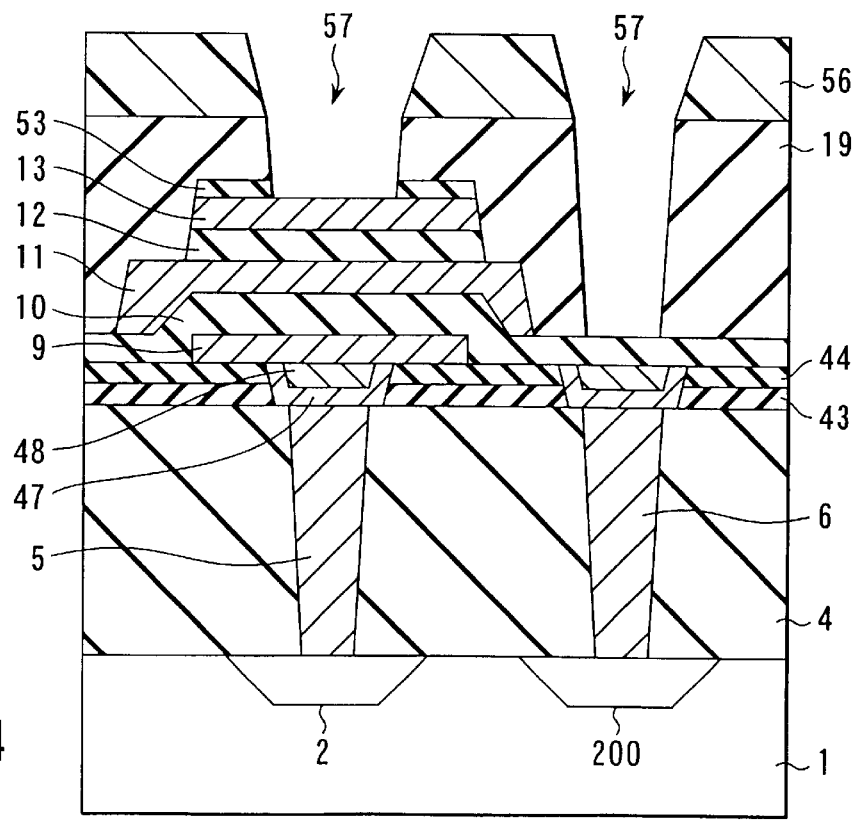
FIG. 24 is a cross sectional view showing a step, which follows the step shown in FIG. 23, of the method of manufacturing the memory cell according to the second embodiment of the present invention.

Further, a second interlayer insulating film 19 formed of a silicon oxide film is deposited by a CVD method on the entire surface, as shown in FIG. 23, followed by planarizing the second interlayer insulating film 19. Then, PEP is applied by coating a photoresist 56, followed by forming contact plug windows 57 connected to the wiring 16 above the plugs 5, 6, as shown in FIG. 24. Further, an oxygen annealing is performed at about 650° C. for one hour so as to restore the process damage of the ferroelectric properties.

Figure 25:
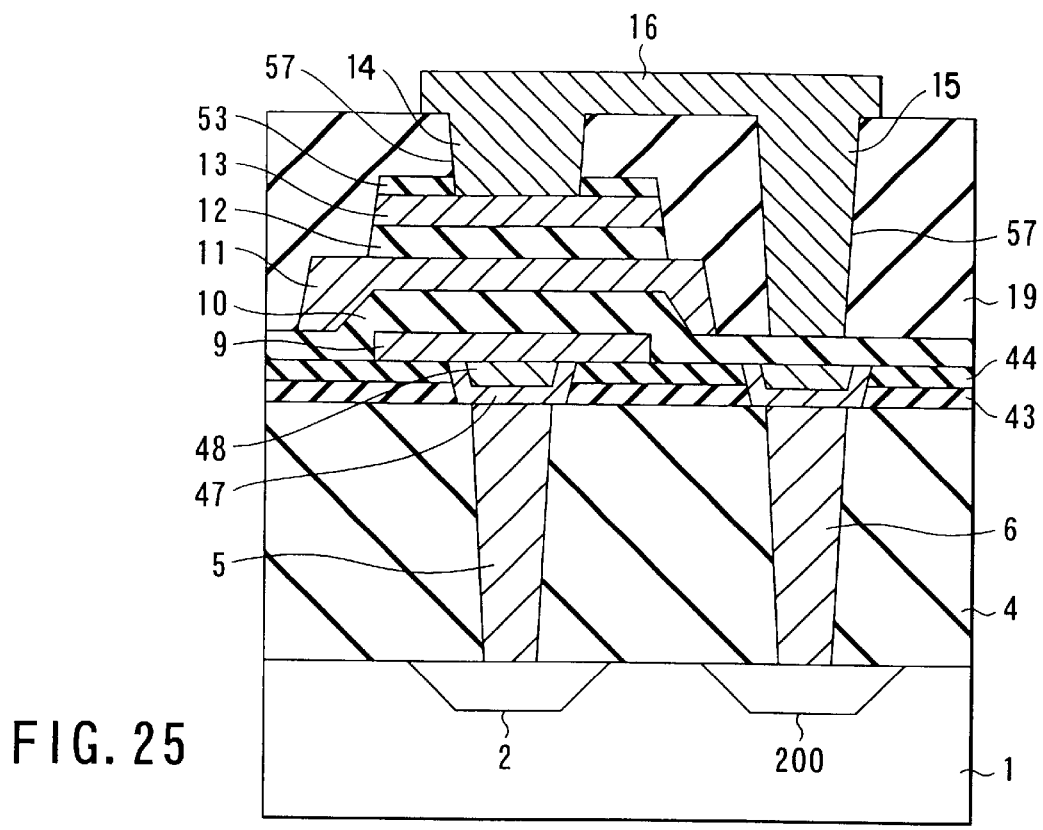
FIG. 25 is a cross sectional view showing a step, which follows the step shown in FIG. 24, of the method of manufacturing the memory cell according to the second embodiment of the present invention.

Finally, the plugs 14, 15 and the material film of the wiring 16 are deposited by a sputtering method so as to form the plugs 14, 15 and the wiring layer 16 as an integral structure shown in FIG. 25. Each of the plugs 14, 15 and the material film of the wiring layer 16 is formed of Al/TiN.

As described above, according to the second embodiment of the present invention, it is possible to suppress the process damage per unit cell capacitance by forming the capacitors in a laminated manner so as to make the capacitor area larger than that in the prior art.

Also, the upper and lower capacitors that are laminated double can be independently utilized as individual memory cell capacitors. In this case, the capacitance per capacitor remains unchanged, compared with the prior art. However, the spaces between the adjacent word lines can be shortened by using any one of the upper side capacitor and the lower side capacitor, which are stacked one upon the other, in the adjacent memory cells so as to make it possible to obtain a highly integrated memory cell.

<Third Embodiment>

A semiconductor memory device according to a third embodiment of the present invention will now be described with reference to FIGS. 26 to 28. The third embodiment is directed to a modification of the first embodiment.

Figure 26:
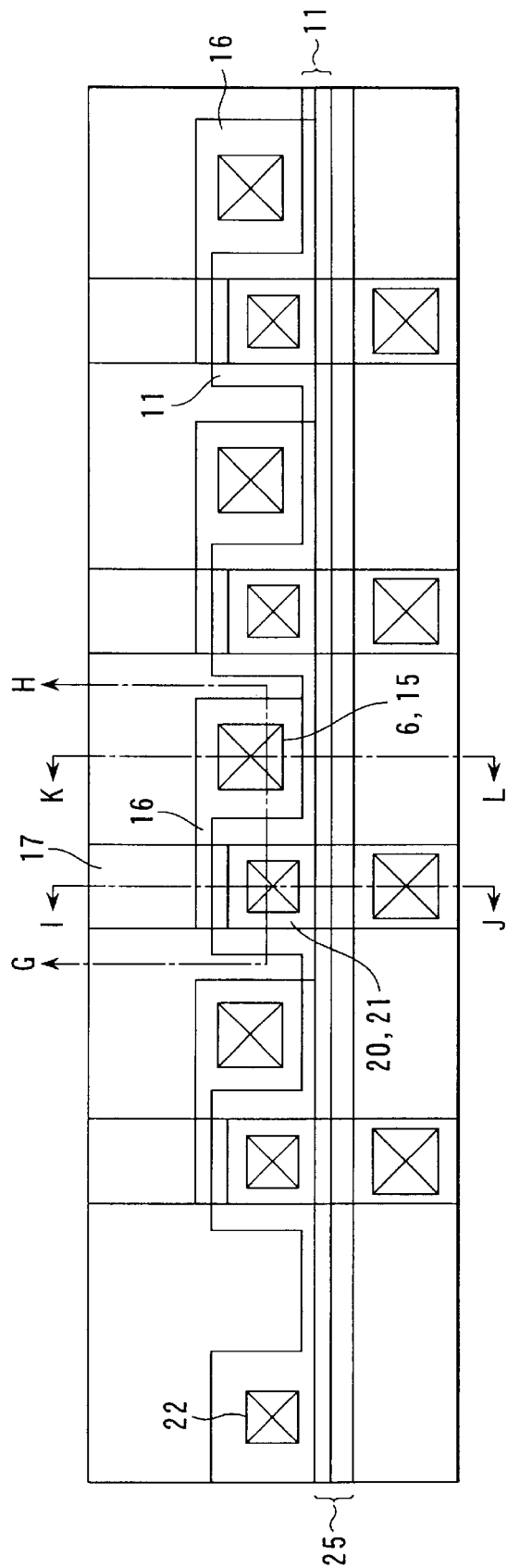
FIG. 26 is a plan view showing the construction of a memory cell according to a third embodiment of the present invention.

FIG. 26 is a plan view showing a semiconductor memory device according to the third embodiment of the present invention. As shown in FIG. 26, the distance between the adjacent bit lines for the third embodiment is two times as large as that for the first embodiment shown in FIG. 2.

In the first embodiment, the first and second ferroelectric capacitors 20, 21 are formed in a stacked fashion in the central portion of FIG. 2 with the plate line 11 used as a common electrode. Also, the first and second memory cell transistors connected to the first and second bit lines 17, 18, respectively, permit the drain diffusion layers 28, 201 to exchange the stored data with the ferroelectric capacitors 20, 21.

On the other hand, the third embodiment of the present invention differs from the first embodiment in that the exchange of the stored data with the first and second ferroelectric capacitors 20, 21 connected in parallel between the source diffusion layer 2 and the plate line 11 is performed in the central portion of FIG. 26 by only the first memory cell transistor having the drain diffusion layer 28 connected to the first bit line 17. As a result, the distance between the adjacent bit lines for the third embodiment is rendered twice as much as that for the first embodiment.

Incidentally, the reference numerals 6 and 15 shown in FIG. 26 are plan views of the contact plug portions corresponding to the same reference numerals in FIG. 6A. The other construction is equal to the plan view of the first embodiment, except that the second bit line 18 and the contact plug connected to the second bit line 18 are not included in the third embodiment and, thus, the description is omitted.

Figure 27:
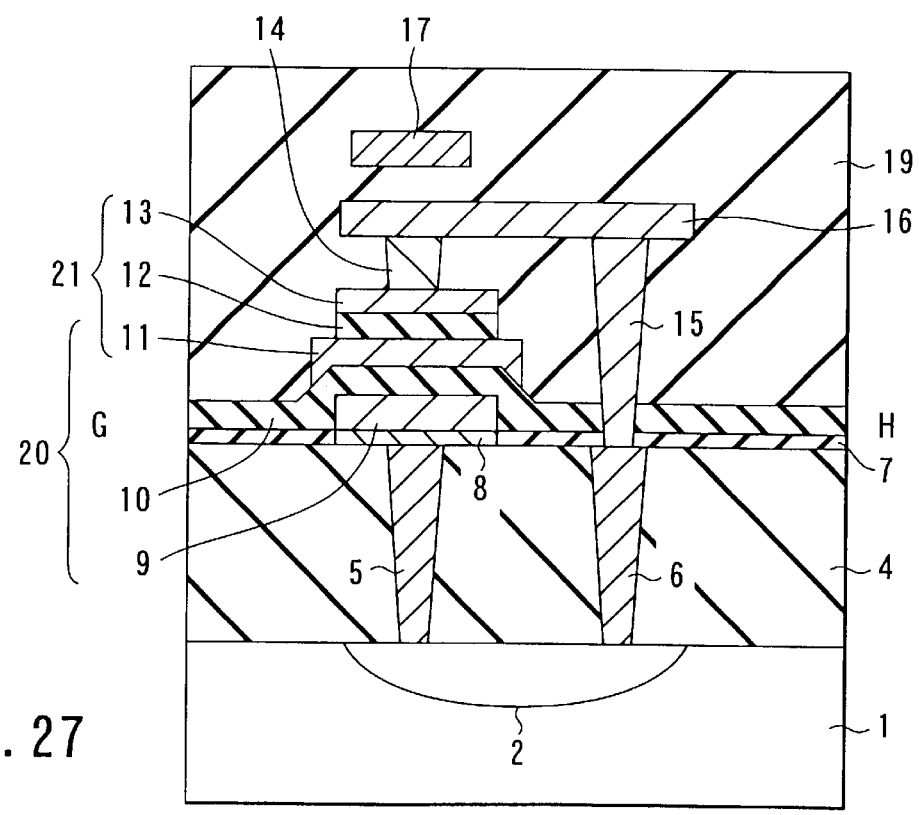
FIG. 27 is a cross sectional view along the line G-H shown in FIG. 26.

FIG. 27 is a cross sectional view along the line G-H shown in FIG. 26. As shown in FIG. 27, the lower electrode 9 of the first ferroelectric capacitor 20 and the upper electrode 13 of the second ferroelectric capacitor are connected to the source diffusion layer 2 of the first memory cell transistor through the plug 14, the wiring 16, the plug 15 and the additional plug 6. In other words, the first and second ferroelectric capacitors 20, 21 are connected in parallel between the single source diffusion layer 2 and the common plate line 11.

It is seen by the comparison between FIG. 27, which is a cross sectional view along the line G-H shown in FIG. 26, and FIG. 3, which is a cross sectional view along the line A-B shown in FIG. 2, that the source diffusion layer 2 in the third embodiment of the present invention is equal to the integral structure formed of the source diffusion layers 2 and 200 in the first embodiment.

Figure 28A:
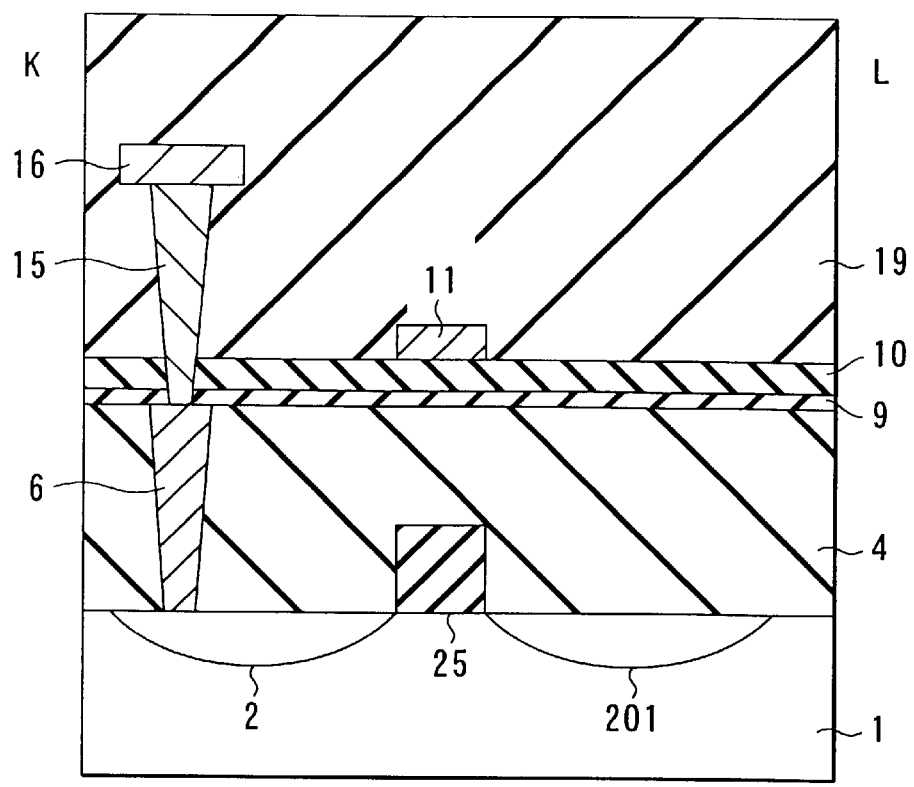
FIG. 28A is a cross sectional view along the line K-L shown in FIG. 26.

The cross section along the line I-J shown in FIG. 26 is equal to the cross section along the line C-D shown in FIG. 2, i.e., equal to FIG. 4 and, thus, the description is omitted. FIG. 28A, which is a cross sectional view along the line K-L shown in FIG. 26, differs from FIG. 5 showing the first embodiment in that the drain diffusion layer 201 of the first transistor is not connected to the second bit line 18.

To be more specific, in the third embodiment of the present invention, the source diffusion layers 2 and 200 of the first and second memory cell transistors included in the first embodiment collectively form a common source diffusion layer 2, and the drain diffusion layer 28 (not shown in FIG. 28A) positioned to face the common source diffusion layer 2 is electrically connected to the first bit line 17.

As described above, in the third embodiment of the present invention, the drain diffusion layer 201 facing the common source diffusion layer 2 is not connected to the second bit line 18, with the result that the drain diffusion layer 201 forms a dummy drain diffusion layer. Therefore, the first memory cell transistor alone is substantially substituted in the third embodiment for the first and second memory cell transistors included in the first embodiment so as to exchange the stored data with the first and second ferroelectric capacitors connected in parallel between the common source diffusion layer 2 and the plate line 11.

It is considered reasonable to understand that it is unnecessary to form the dummy drain diffusion layer 201 separated from the drain diffusion layer 28 connected to the first bit line 17. However, in view of, for example, the regularity of the mask pattern, it is advantageous in some cases in terms of the miniaturization to leave the dummy drain diffusion layer 201 unremoved. Such being the situation, the third embodiment covers a case where the dummy drain diffusion layer 201 is left unremoved and a case where the dummy drain diffusion layer 201 is made integral with the drain diffusion layer 28 or is deleted.

Figure 28B:
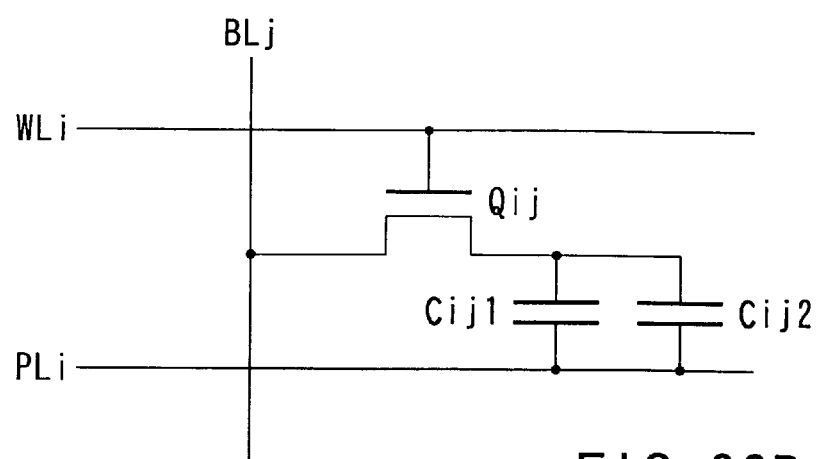
FIG. 28B is an equivalent circuit diagram showing the memory cell according to the third embodiment of the present invention.

FIG. 28B shows an equivalent circuit diagram of the third embodiment. The marks BLj and WLi shown in FIG. 28B correspond to the first bit line 17 and the word line 25, respectively, and the mark PLi corresponds to the plate line 11. Further, the marks Qij, Cij1 and Cij2 correspond to the first memory cell transistor, the first ferroelectric capacitor 20 and the second ferroelectric capacitor 21, respectively.

The first and second ferroelectric capacitors 20, 21, which are stacked one upon the other, are used in the third embodiment of the present invention so as to increase the capacitance of the memory cell capacitor connected to a single memory cell transistor. In other words, by stacking the ferroelectric capacitors, it is possible to provide a semiconductor memory device having a memory cell capacitor having an area larger than that in the prior art.

<Fourth Embodiment>

A semiconductor memory device according to a fourth embodiment of the present invention will now be described with reference to FIGS. 29 to 31. In the fourth embodiment of the present invention, the stacked ferroelectric capacitor structure is applied to the series connected TC parallel unit ferroelectric memory.

Figure 29:
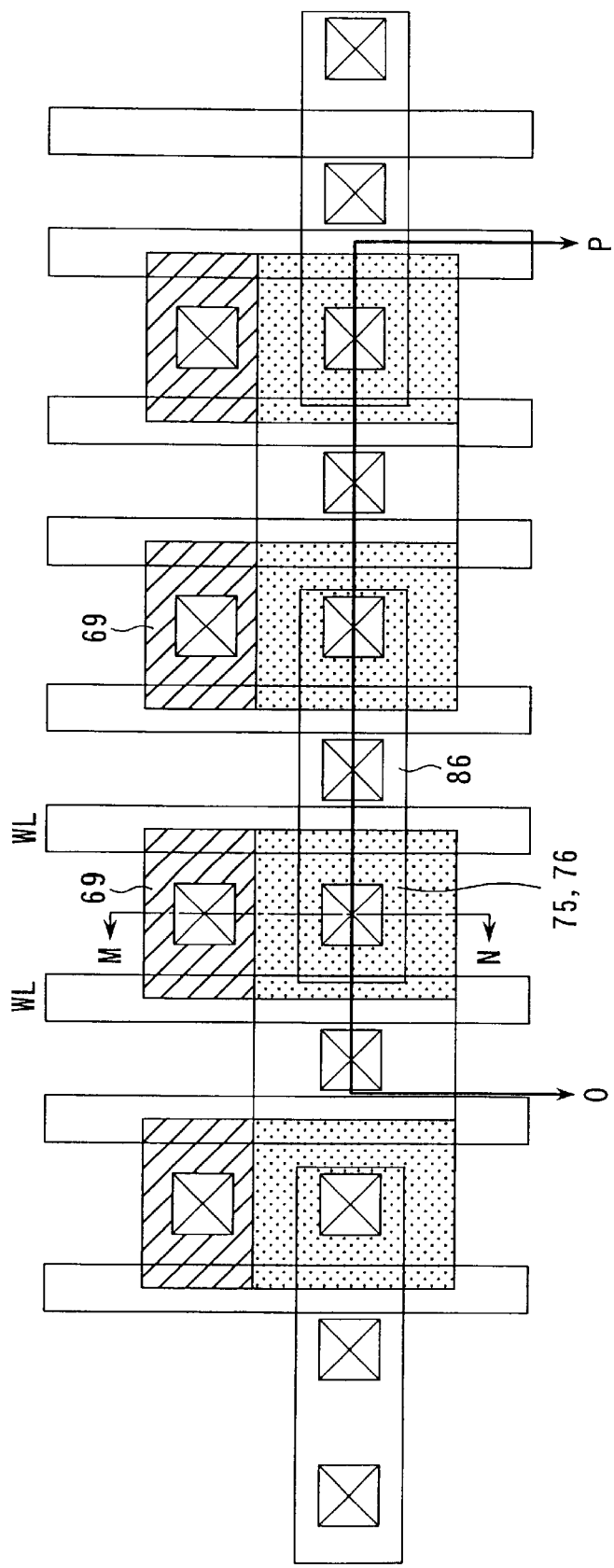
FIG. 29 is a plan view showing the construction of the memory cell according to a fourth embodiment of the present invention.

FIG. 29 is a plan view showing the construction of a semiconductor memory device according to the fourth embodiment of the present invention. As shown in FIG. 29, in the semiconductor memory device according to the fourth embodiment, a single memory cell transistor and a unit, in which stacked first and second ferroelectric capacitors 75, 76 are connected in parallel, collectively form a unit cell, and a plurality of unit cells of the particular structure are connected in series.

To be more specific, the lower electrode of the first ferroelectric capacitor 75 is connected to any one of the source and drain regions positioned adjacent to the word line WL (gate), and the upper electrode of the second ferroelectric capacitor 76 stacked on the first ferroelectric capacitor 75 is connected to the other of the source and drain regions so as to form the unit cell noted above. Incidentally, the first ferroelectric capacitor 75 is formed below a common electrode 69, and the second ferroelectric capacitor is formed above the common electrode 69.

One block of the memory cell is formed of a unit cell of 8 or 16 bits. FIG. 29 shows a wiring 86 for connecting the second upper electrodes in the adjacent stacked type first and second ferroelectric capacitors and the common electrode 69 led out in the direction of the word line.

As described above, the stacked first and second ferroelectric capacitors and the memory cell transistor positioned below the ferroelectric capacitors are arranged repeatedly in the left-right direction in FIG. 29 so as to form a memory cell of a single block, and a plurality of said memory cell blocks are repeatedly arranged in the same direction. Also, a plurality of word lines WL are arranged in a direction perpendicular to the longitudinal direction of the memory cell block.

In general, 8 or 16 memory cell transistors and memory cell capacitors each comprising a ferroelectric film are included in a single memory cell block. However, it is possible to change appropriately the number of memory cell transistors and memory cell capacitors included in the single memory cell block. The memory cell transistors are connected in series within the memory cell block. Also, the gates of the memory cell transistors collectively form a single word line.

Figures 30A, 30B:
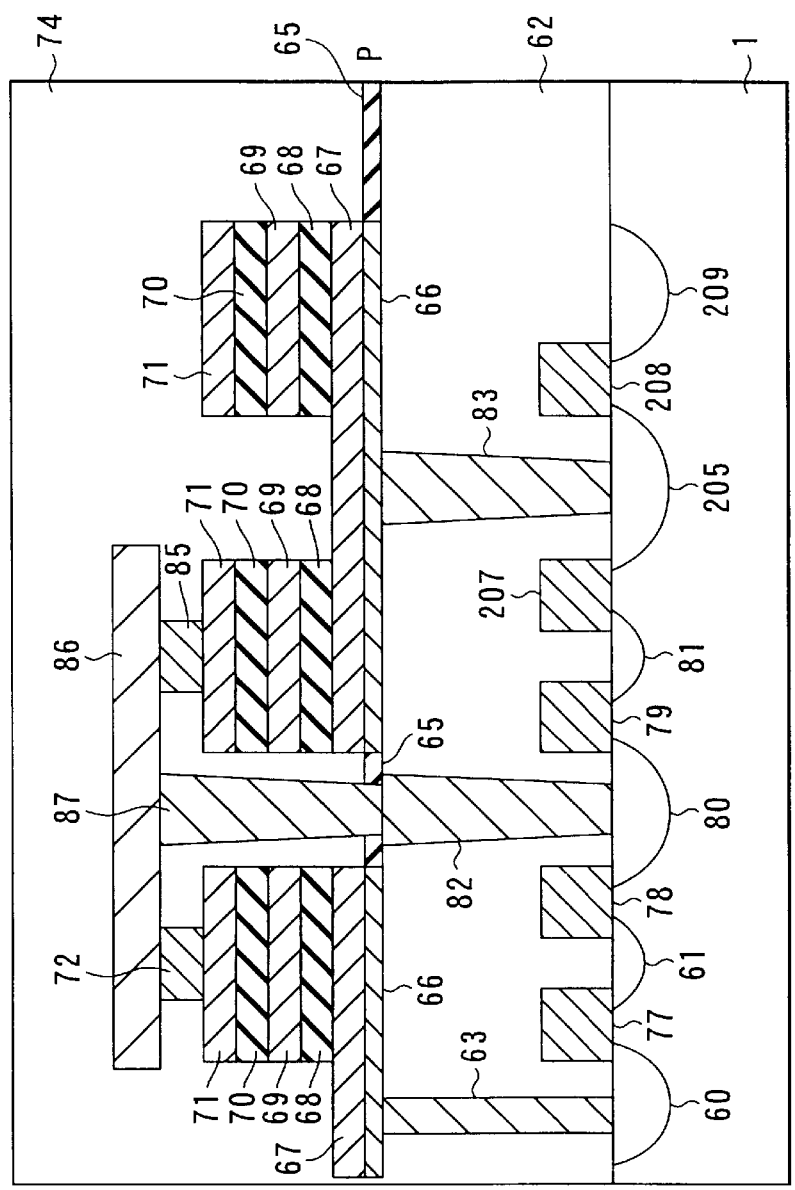
FIG. 30A is a cross sectional view along the line M-N shown in FIG. 29.
FIG. 30B is a cross sectional view along the line O-P shown in FIG. 29.

FIG. 30A is a cross sectional view along the line M-N shown in FIG. 29. As shown in FIG. 30A, a first diffusion layer 60 and a second diffusion layer 61 are formed in a semiconductor substrate 1. The first and second diffusion layers form the source/drain diffusion layers. The second diffusion layer 61 alone is shown in FIG. 30A, which is a cross sectional view along the line M-N shown in FIG. 29. A word line (gate) 77, which is formed between the first diffusion layer 60 and the second diffusion layer 61, is not shown in FIG. 30A, which is a cross sectional view along the line M-N shown in FIG. 29.

A first interlayer insulating film 62 is formed on the semiconductor substrate 1 and the word line 77. A plug 63 electrically connected to the first diffusion layer 60 and a plug 64 electrically connected to the second diffusion layer 61 are formed in the first interlayer insulating film 62. However, the first diffusion layer 60 and the plug 63 are not shown in FIG. 30A, which is a cross sectional view along the line M-N shown in FIG. 29.

A reaction protective film 65 for the ferroelectric film is formed on the first interlayer insulating film 62. The reaction protective film 65 for the ferroelectric film is formed of, for example, a silicon nitride film (SiN), and an alumina film ($Al_2O_3$) or a titanium oxide film stacked on the silicon nitride film. A protective film 66 is formed on the first plug 64 within the reaction protective film 65 for the ferroelectric film. The protective film 66 comprises, for example, a TiAlN film and an $IrO_x$ film formed on the TiAlN film.

A ferroelectric film 68 is formed on a lower electrode 67 of the first ferroelectric capacitor electrically connected to the plug 63 via the protective film 66, and a common electrode 69 with the second ferroelectric capacitor is formed on the ferroelectric film 68. The common electrode 69 is formed longer than the lower electrode 67 in FIG. 30A, which is a cross sectional view along the line M-N shown in FIG. 29. A second ferroelectric film 70 is formed on the common electrode 69. The second ferroelectric film 70 is formed shorter than the common electrode 69 in FIG. 30A, which is a cross sectional view along the line M-N shown in FIG. 29.

An upper electrode 71 is formed on the second ferroelectric film 70, and a plug 72 is formed on the upper electrode 71. On the other hand, a plug 73 electrically connected to the plug 64 via the protective film 66 is formed to extend through the reaction protective film 65 for the ferroelectric film, the ferroelectric film 68 and the common electrode 69. In this step, the second diffusion layer 61 is electrically connected to the common electrode 69 of the first and second ferroelectric capacitors. Also, a second interlayer insulating film 74 is formed to cover all the constituents of the semiconductor memory device described above.

The upper edge portion of the plug 72 is connected to a wiring 86. However, the upper edge portion of the plug 73 is nowhere connected and, thus, to form a dummy plug. It follows that the plug 73 simply serves to permit the lower portion to be electrically connected to the common electrode 69. In other words, that portion of the plug 73 which protrudes above the common electrode 69 is considered to be unnecessary.

However, as apparent from a fifth embodiment of the present invention, which is to be described herein later, many plugs required for the construction of the memory cell of the present invention are collectively formed in the same interlayer insulating film and, thus, it is advantageous in terms of the number of required process steps to align the height of the plugs. Such being the situation, the plug 73 is formed as a dummy plug.

As described above, formed are the first capacitor 75 comprising the lower electrode 67, the ferroelectric film 68 and the common electrode 69, and the second capacitor 76 formed on the first capacitor 75 and comprising the common electrode 69, the ferroelectric film 70 and the upper electrode 71. Incidentally, the oxidation protective film for the plug electrode, etc., which may be actually present, are omitted in the cross sectional view showing the construction according to the fourth embodiment of the present invention.

FIG. 30B is a cross sectional view along the line O-P shown in FIG. 29. In the actual device, the construction shown in FIG. 30B is repeatedly arranged in the left-right direction of FIG. 30B. As shown in FIG. 30B, first to fifth word lines (gates) 77, 78, 79, 207 and 208 are formed below the lower electrode 67. A first diffusion layer 60, a second diffusion layer 61, a third diffusion layer 80, a fourth diffusion layer 81, a fifth diffusion layer 205 and a sixth diffusion layer 209 are formed in the semiconductor substrate 1 on both sides of the first to fifth word lines 77, 78, 79, 207 and 208.

Formed in the first interlayer insulating film 62 are a plug 63 electrically connected to the first diffusion layer 60, a plug 82 electrically connected to the third diffusion layer 80, and a plug 83 electrically connected to the fifth diffusion layer 205. Further, a ferroelectric film 65 is formed on the first interlayer insulating film 62.

A protective film 66 is formed on the plugs 63, 83 within the reaction protective film 65 for the ferroelectric film, and a lower electrode 67 is formed on the protective film 66 in two positions in FIG. 30B. A ferroelectric film 68, a common electrode 69, a ferroelectric film 70 and an upper electrode 71 are laminated in the order mentioned on the protective film 66 and the lower electrode 67 so as to form stacked first and second ferroelectric capacitors in three positions in FIG. 30B.

A plug 72 is formed on the upper electrode 71 on the left side, and a plug 85 is formed on the central upper electrode 71. Also, formed is a wiring 86 for connecting the plugs 72 and 85, and formed is a plug 87 for connecting the wiring 86 to the plug 82 through the reaction protective film 65 for the ferroelectric film. Further, a second interlayer insulating film 74 is formed to cover all the constituents of the semiconductor memory device.

Figure 31A:
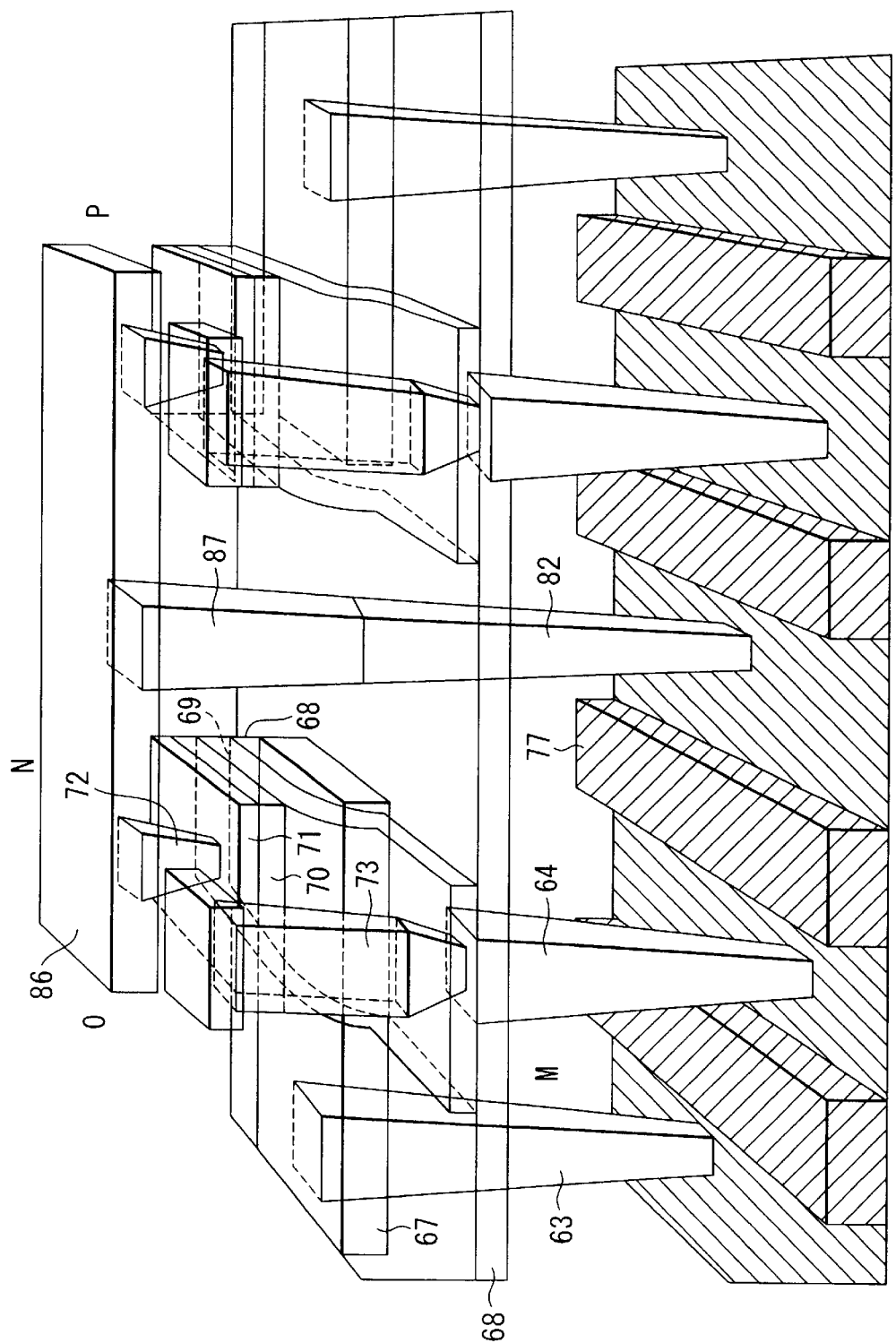
FIG. 31A is an oblique view showing the construction of the memory cell according to the fourth embodiment of the present invention in the vicinity of the lines M-N and O-P shown in FIG. 29.

As shown in FIG. 30B, the upper electrode 71 of the second ferroelectric capacitor formed above the first gate 77 is electrically connected to the upper electrode 71 of the second ferroelectric capacitor formed above the second gate 79 by the wiring 86. Incidentally, FIG. 31A is an oblique view showing the shape in the vicinity of the line M-N shown in FIG. 29. The left-right direction in the rear portion of FIG. 31A shows the shape in the vicinity of the line O-P shown in FIG. 29.

As shown in the oblique view of FIG. 31A, the dummy plug 73 serving to electrically connect the common electrode 69 of the stacked first and second ferroelectric capacitors to the plug 64 is formed to protrude above the common electrode 69.

Figure 31B:
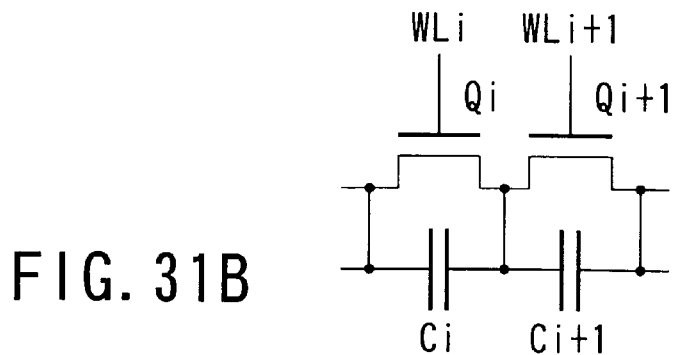
FIG. 31B is an equivalent circuit diagram of the region shown in FIG. 31A of the memory cell according to the fourth embodiment of the present invention.

FIG. 31B is an equivalent circuit diagram of the structure shown in FIG. 31A. The marks Qi and Qi+1 shown in FIG. 31B correspond to two memory cell transistors connected in series and sharing the source/drain regions on the left side in FIG. 31A, and the marks Ci and Ci+1 correspond to the first and second ferroelectric capacitors stacked on the left side in FIG. 31A. Further, the marks WLi and Wli+1 correspond to the gate of two memory cell transistors.

In the fourth embodiment of the present invention, each of the ferroelectric films 68 and 70 has a thickness falling within a range of, for example, between 0.1 $\mu$m and 0.3 $\mu$m. Also, each of the lower electrode 67, the common electrode 69 and the upper electrode 71 has a thickness falling within a range of, for example, between 0.1 μm and 0.2 μm. Further, each of the gates (word lines) 77, 78, 79, 207 and 208 has a thickness of about 0.2 μm. The dimensions noted above are no more than an example, and it is possible to change these dimensions appropriately depending on the design and the specification.

Incidentally, each of the lower electrode 67, the common electrode 69 and the upper electrode 71 is of a laminate structure comprising a Ti film and, for example, a Pt film laminated on the Ti film and having a thickness of about 0.1 μm. It is also possible to use a Si layer or a metal layer as the lower electrode of the Pt film. Further, it is possible to use as the lower electrode an Ir film, an $IrO_2$ film, a laminate structure of Ti/TiN/Pt, a SrRuO film, a Ru film, a RuO film, etc.

A mixed crystal film of SrBiTaO, a mixed crystal film of PbZrTiO (PZT; $Pb(Zr_xTi_{1-x})O_3$), etc. can be used as the ferroelectric film. In the case of using the PZT film, the film thickness is set at, for example, about 0.15 μm. It is also possible to use, for example, a mixed crystal film of the BaSrTiO system, $BaTiO_3$, PLZT, $LiNbO_3$, and $K_3Li_2Nb_5O_{15}$ as the ferroelectric film. In other words, any of the oxide ferroelectric film with ionic bonding characteristics can be effectively used as a ferroelectric capacitor film. The interlayer insulating film can be formed by using BPSG or TEOS. Further, the bit line can be formed by using a metal such as Al.

As described previously, ferroelectric capacitors are stacked one upon the other in the fourth embodiment of the present invention. The particular construction is adapted for the improvement in the degree of integration, compared with the prior art in which a single ferroelectric capacitor is arranged on the same plane, so as to make it possible to decrease the distance between the adjacent bit lines and the distance between the adjacent word lines without decreasing the capacitance of the capacitor. Also, it is possible to suppress the process damage to the capacitor without lowering the degree of integration, even if the capacitor area is made larger than that in the prior art.

It should also be noted that, where the fourth embodiment of the present invention is constructed to ensure the capacitor area equal to that in the prior art, it is possible to decrease the width of the word line and the space between the adjacent word lines. It follows that it is possible to decrease the area of the memory cell transistor below the capacitor to a level small than half the area in the prior art so as to make it possible to markedly improve the degree of integration. In other words, the fourth embodiment of the present invention make it possible to increase the capacitor area per memory cell transistor, compared with the prior art.

As described above, in the fourth embodiment of the present invention, it is possible to realize easily a ferroelectric memory including ferroelectric capacitors formed at a high degree of integration and having a large area by stacking the ferroelectric capacitors. Since a COP (capacitor on plug) structure is employed in the fourth embodiment, it is possible to reduce the area for the plug by arranging the plug within the capacitor region, which is effective for improving the degree of integration. However, the present invention is not limited to the COP structure and can be widely applied to other structures.

<Fifth Embodiment>

A fifth embodiment of the present invention will now be described with reference to FIGS. 32 to 36.

The fifth embodiment is directed to an example of a manufacturing method of the ferroelectric capacitor described in conjunction with the fourth embodiment.

FIGS. 32 to 36 collectively show the method of manufacturing the ferroelectric capacitor having the cross sectional structure shown in FIG. 30A and FIG. 30B. In the manufacturing method of the ferroelectric capacitor according to the fifth embodiment of the present invention, the steps shown in FIGS. 7 to 21 described previously in conjunction with the second embodiment can be employed as they are. The steps after the step shown in FIG. 21 will now be described.

Figure 32:
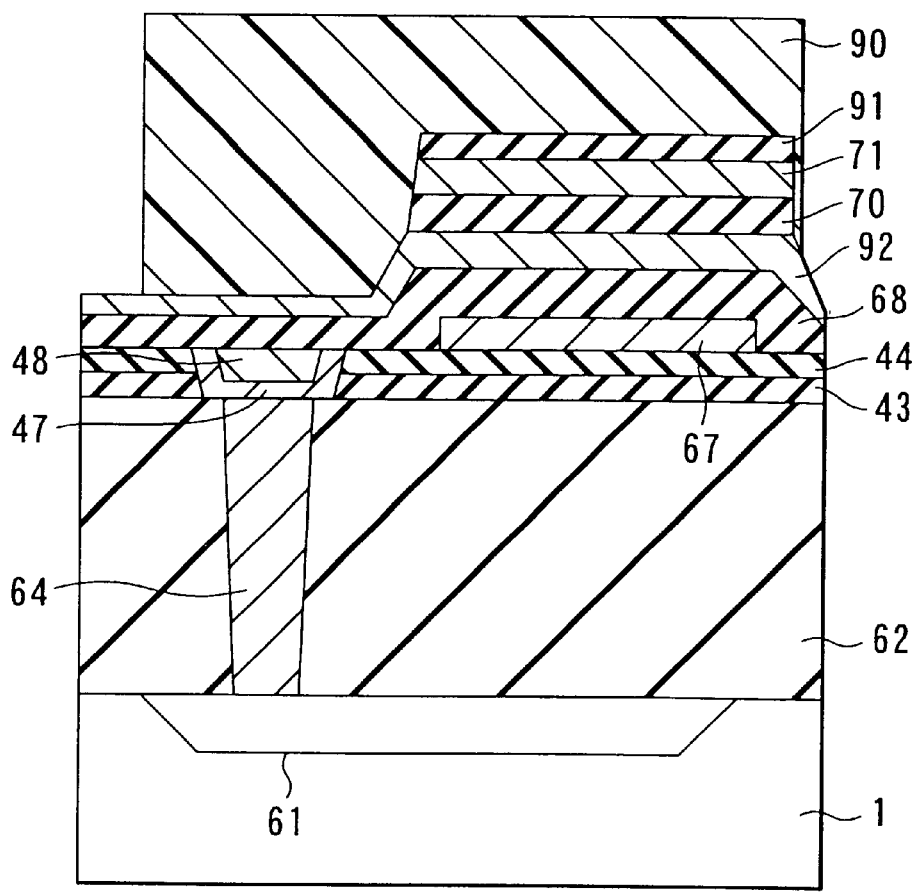
FIG. 32 is a cross sectional view showing a step of the method of manufacturing the memory cell according to a fifth embodiment of the present invention.
Figure 33:
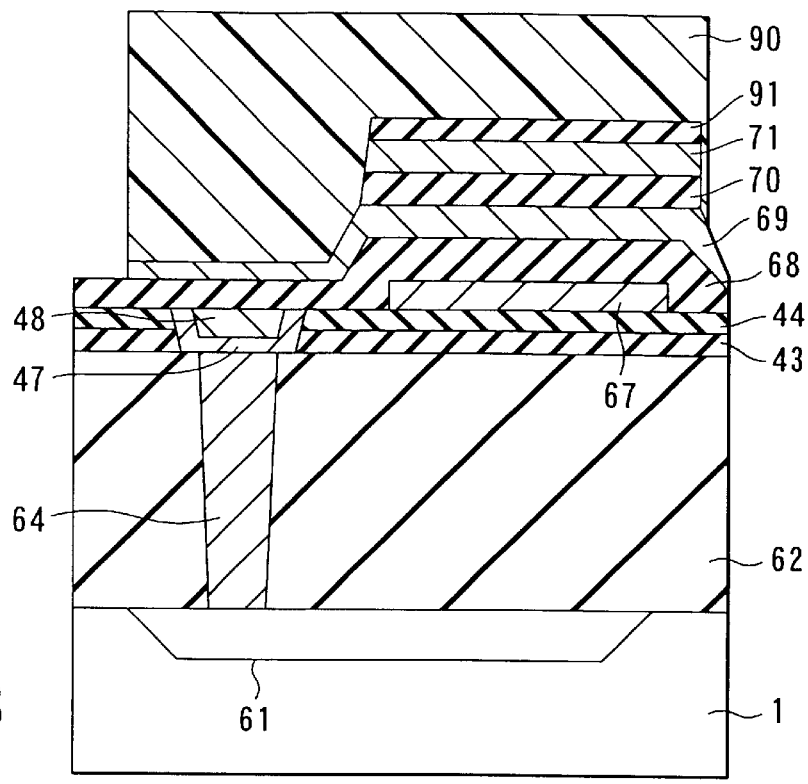
FIG. 33 is a cross sectional view showing a step, which follows the step shown in FIG. 32, of the method of manufacturing the memory cell according to the fifth embodiment of the present invention.

As shown in FIG. 32, a photoresist 90 is formed on the protective film 91 on the upper electrode 71 and the common electrode 92. Then, PEP is applied to the common electrode 92 so as to form the common electrode 69, thereby forming the first and second stacked ferroelectric capacitors as shown in FIG. 33.

Figure 34:
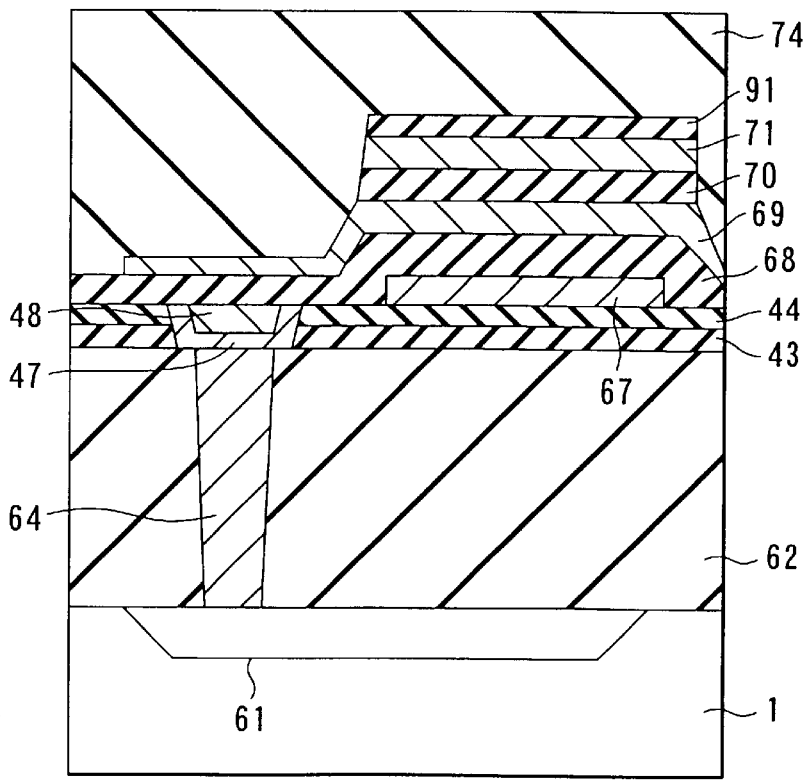
FIG. 34 is a cross sectional view showing a step, which follows the step shown in FIG. 33, of the method of manufacturing the memory cell according to the fifth embodiment of the present invention.
Figure 35:
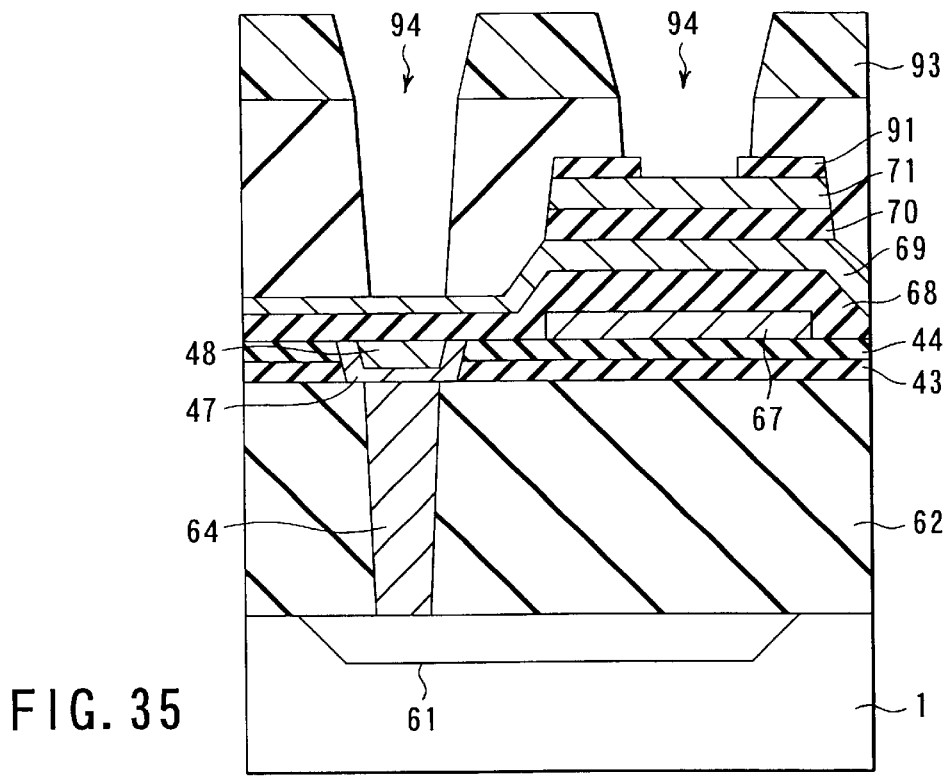
FIG. 35 is a cross sectional view showing a step, which follows the step shown in FIG. 34, of the method of manufacturing the memory cell according to the fifth embodiment of the present invention.

In the next step, a second interlayer insulating film 74 formed of a silicon oxide film is deposited on the first and second ferroelectric capacitors, followed by planarizing the second interlayer insulating film 74, as shown in FIG. 34. Then, a photoresist 93 is formed and PEP is applied to the photoresist 93 so as to form a contact plug window 94 by a dry etching method above the plugs 63 and 64, as shown in FIG. 35.

Figure 36:
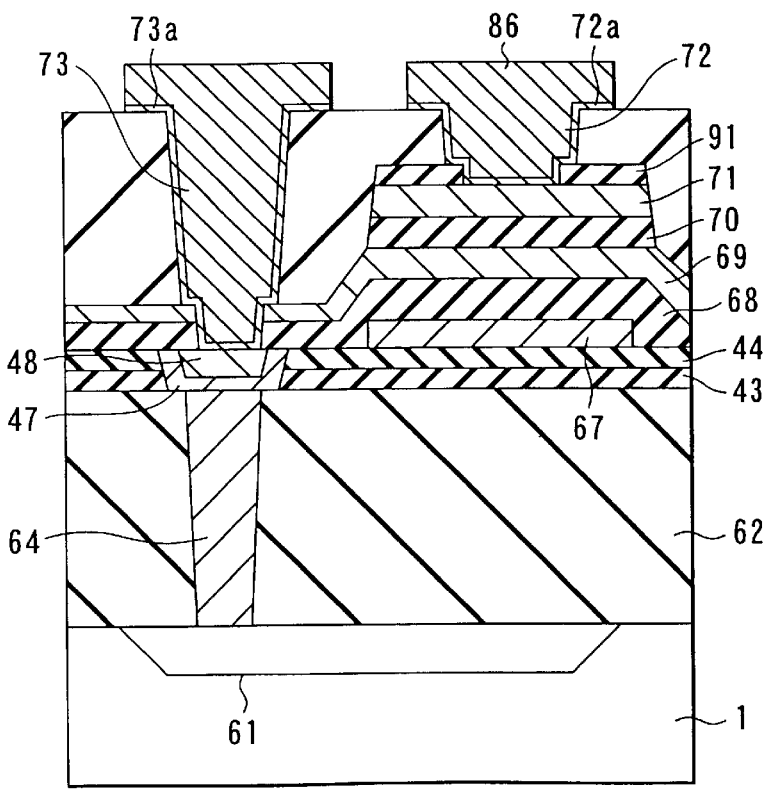
FIG. 36 is a cross sectional view showing a step, which follows the step shown in FIG. 35, of the method of manufacturing the memory cell according to the fifth embodiment of the present invention.

Then, an oxygen annealing is applied at 650° C. for one hour so as to restore the process damage of the ferroelectric characteristics, followed by depositing the material films of a plug and a wiring by a sputtering method and subsequently patterning the deposited films so as to collectively form the plugs 72, 73 and the wiring 86, as shown in FIG. 36. Incidentally, reference numerals 72a and 73a denote the diffusion preventing layers of the plug and the wiring material, respectively.

Al/TiN was used as the plug electrode material. The TiN layer forms a diffusion preventing layer serving to prevent the Al diffusion between the lower surfaces of the plug 72 and the wiring 86, and the upper electrode 71 and the protective film 91. It is possible to use other diffusion preventing layers.

In the formation of the cross sectional structure for the fifth embodiment shown in FIG. 30B, the connection between the upper electrode 71 and the third diffusion layer 80 can be performed like the connection between the upper electrode 13 and the source diffusion layer 200 in the second embodiment shown in FIG. 25.

As described above, according to the manufacturing method for the fifth embodiment of the present invention, the capacitors are formed in a stacked fashion so as to make it possible to form two capacitors in a stacked fashion on two transistors in contrast to the prior art in which a single capacitor is formed on a single transistor. It follows that each capacitor area occupies the region of two transistors, which is larger than that in the prior art. It follows that the influence given by the cell size reduction to the capacitor area can be suppressed even if the memory cell size is reduced. As a result, the process damage can be suppressed so as to prevent the defect occurrence in the manufacturing process, thereby improving the reliability of the semiconductor memory device.

According to the fifth embodiment of the present invention, the lower electrode 67 can be shared by the adjacent transistors so as to further improve the degree of integration, compared with the first embodiment of the present invention. In the direct connection in the fifth embodiment of the present invention, two capacitors each having a ferroelectric film of a two layer structure are combined, and the upper electrode is connected to the diffusion layer in the semiconductor substrate by using a single plug. As a result, it is possible to markedly reduce the area for arranging the plug for connecting the upper electrode to the diffusion layer. Incidentally, the present invention is not limited to the embodiments described above and can be modified in various fashions within the technical scope of the present invention.

According to the present invention, it is possible to provide a semiconductor memory device capable of enhancing the degree of integration without decreasing the capacitance of the capacitor included in the memory cell and to provide a method of manufacturing the particular semiconductor memory device.

What is claimed is:

1. A semiconductor memory device, comprising:
    a semiconductor substrate;
    an interlayer insulating film formed on said semiconductor substrate;
    a first electrode formed on said interlayer insulating film;
    a first ferroelectric film formed on said first electrode;
    a second electrode formed on said first ferroelectric film, the second electrode having an extension layer portion forming a first plate line layer, the first plate line layer connected to a first source/drain region of a first memory cell transistor via a first contact plug formed in the interlayer insulating film;
    a second ferroelectric film formed on said second electrode;
    a third electrode formed on said second ferroelectric film;
    a second plate line layer connected to said third electrode via a second contact plug and connected to a second source/drain region of a second memory cell transistor via a third contact plug;
    a first bit line layer connected to the first drain/source region via a fourth contact plug; and
    a second bit line layer connected to the second drain/source region via a fifth contact plug.

2. The semiconductor memory device according to claim 1, further comprising a word line formed below said first electrode and extending in a first direction, said second electrode formed longer than said first electrode in said first direction.

3. The semiconductor memory device according to claim 1, wherein each of said first and second ferroelectric films is formed of an oxide ferro electric film with ionic bonding characteristics and selected from the group consisting of a SrBiTaO series film, a PbZrTiO series film (including PZT; $Pb(Zr_xTi_{1-x})O_3$), a BaSrTiO series film, a $BaTiO_3$ film, a PLZT film, $LiNbO_3$ film and a $K_3Li_2Nb_5O_{15}$ film.

4. The semiconductor memory device according to claim 1, wherein each of said first to third electrodes is formed of a film selected from the group consisting of a Pt film, an Ir film, an $IrO_2$ film, a SrRuO film, a Ru film and a RuO film, and a laminate structure selected from the group consisting of a Ti/Pt laminate film and a Ti/TiN/Pt laminate film.

5. A semiconductor memory device, comprising:
    a semiconductor substrate;
    a first transistor formed on said semiconductor substrate and having a first gate, a first source formed of a first diffusion layer and a first drain formed of a second diffusion layer, said first and second diffusion layers being arranged to face each other with said first gate interposed therebetween;
    a second transistor formed on said semiconductor substrate, positioned adjacent to said first transistor, and having a second gate, a second source formed of a third diffusion layer and a second drain formed of a fourth diffusion layer, said third and fourth diffusion layers being arranged to face each other with said second gate interposed therebetween;
    a first plug electrode connected to said first diffusion layer;
    a second plug electrode connected to said second diffusion layer;
    a third plug electrode connected to said third diffusion layer;
    a fourth plug electrode connected to said fourth diffusion layer;
    a first bit line connected to said second plug electrode;
    a second bit line connected to said fourth plug electrode;
    a first electrode connected to said first diffusion layer through said first plug electrode;
    a first ferroelectric film formed on said first electrode;
    a second electrode formed on said first ferroelectric film;
    a second ferroelectric film formed on said second electrode;
    a third electrode formed on said second ferroelectric film; and
    a wiring connected to said third electrode and said third diffusion layer.

6. The semiconductor memory device according to claim 5, further comprising:
    a word line connecting said first and second gates;
    a plate line formed to extend toward said word line forming said second electrode;
    a first ferroelectric capacitor comprising said first electrode, the first ferroelectric film formed on said first electrode, and the second electrode formed on said first ferroelectric film; and
    a second ferroelectric capacitor comprising said second electrode, the second ferroelectric film formed on said second electrode, and the third electrode formed on said second ferroelectric film;
    wherein:
        said first drain is connected to said first bit line;
        said first source is connected to said first electrode of said first ferroelectric capacitor;
        said second drain is connected to said second bit line; and
        said second source is connected to said third electrode of said second ferroelectric capacitor.

7. The semiconductor memory device according to claim 5, wherein each of said first and second ferroelectric films is formed of an oxide ferroelectric film with ionic bonding characteristics and selected from the group consisting of a SrBiTaO series film, a PbZrTiO series film (including PZT; $Pb(Zr_xTi_{1-x})O_3$), a BaSrTiO series film, a $BaTiO_3$ film, a PLZT film, $LiNbO_3$ film and a $K_3Li_2Nb_5O_{15}$ film.

8. The semiconductor memory device according to claim 5, wherein each of said first to third electrodes is formed of a film selected from the group consisting of a Pt film, an Ir film, an $IrO_2$ film, a SrRuO film, a Ru film and a RuO film, and a laminate structure selected from the group consisting of a Ti/Pt laminate film and a Ti/TiN/Pt laminate film.

9. A semiconductor memory device, comprising:
    a semiconductor substrate;
    a first transistor formed on the semiconductor substrate and having a first gate, a first source formed of a first diffusion layer, and a first drain formed of a second diffusion layer, said first and second diffusion layers being arranged to face each other with said first gate interposed therebetween;

a second transistor formed on said semiconductor substrate, positioned adjacent to said first transistor, and having a second gate, and a second drain formed of a third diffusion layer arranged to face said first diffusion layer with said second gate interposed therebetween, said first and second transistors sharing said first source;

a first plug electrode connected to said first diffusion layer;

a second plug electrode connected to said second diffusion layer;

a third plug electrode positioned apart from said first plug electrode and connected to said first diffusion layer;

a bit line connected to said second plug electrode;

a first electrode connected to said first diffusion layer through said first plug electrode;

a first ferroelectric film formed on said first electrode;

a second electrode formed on said first ferroelectric film;

a second ferroelectric film formed on said second electrode;

a third electrode formed on said second ferroelectric film; and a wiring connected to said third electrode and said first diffusion layer through said third plug electrode.

10. A semiconductor memory device, comprising:

a semiconductor substrate;

a transistor formed on the semiconductor substrate and having a gate, a source formed of a first diffusion layer and a drain formed of a second diffusion layer, said first and second diffusion layers being arranged to face each other with said gate interposed therebetween;

a first plug electrode connected to said first diffusion layer;

a second plug electrode connected to said second diffusion layer;

a third plug electrode positioned apart from said first plug electrode and connected to said first diffusion layer;

a bit line connected to said second plug electrode;

a first electrode connected to said first diffusion layer through said first plug electrode;

a first ferroelectric film formed on said first electrode;

a second electrode formed on said first ferroelectric film;

a second ferroelectric film formed on said second electrode;

a third electrode formed on said second ferroelectric film; and a wiring connected to said third electrode and to said first diffusion layer through said third plug electrode.

11. The semiconductor memory device according to claim 10, further comprising:

a word line connected to said gate;

a plate line formed to extend toward said word line forming said second electrode;

a first ferroelectric capacitor comprising said first electrode, the first ferroelectric film formed on said first electrode, and the second electrode formed on said first ferroelectric film; and a second ferroelectric capacitor comprising said second electrode, the second ferroelectric film formed on said second electrode, and the third electrode formed on said second ferroelectric film;

wherein:

said drain is connected to said bit line; and said source is connected to said first electrode of said first ferroelectric capacitor and to said third electrode of said second ferroelectric capacitor.

12. The semiconductor memory device according to claim 10, wherein each of said first and second ferroelectric films is formed of an oxide ferroelectric film with ionic bonding characteristics and selected from the group consisting of a SrBiTaO series film, a PbZrTiO series film (including PZT; $Pb(Zr_xTi_{1-x})O_3$), a BaSrTiO series film, a $BaTiO_3$ film, a PLZT film, $LiNbO_3$ film and a $K_3Li_2Nb_5O_{15}$ film.

13. The semiconductor memory device according to claim 10, wherein each of said first to third electrodes is formed of a film selected from the group consisting of a Pt film, an Ir film, an $IrO_2$ film, a SrRuO film, a Ru film and a RuO film, and a laminate structure selected from the group consisting of a Ti/Pt laminate film and a Ti/TiN/Pt laminate film.

14. A semiconductor memory device, comprising:

a first ferroelectric capacitor including a first ferroelectric film interposed between a first upper electrode and a first lower electrode arranged to face each other; and a second ferroelectric capacitor including a second ferroelectric film interposed between a second upper electrode and a second lower electrode arranged to face each other;

wherein said semiconductor memory device includes a ferroelectric capacitor portion in which said second ferroelectric capacitor is stacked on an upper side of said first ferroelectric capacitor with said upper electrode of said first ferroelectric capacitor used as a common electrode of said first and second ferroelectric capacitors.

15. The semiconductor memory device according to claim 14, wherein at least three ferro electric capacitor portions are arranged adjacent to each other, said at least three ferroelectric capacitor portions include first, second and third ferroelectric capacitor portions positioned adjacent to each other, said first ferroelectric capacitor portion is connected to said second ferroelectric capacitor portion in said lower electrode of said first ferroelectric capacitor, and said second ferroelectric capacitor portion is connected to said third ferroelectric capacitor portion in said upper electrode of said second ferroelectric capacitor.

16. The semiconductor memory device according to claim 14, wherein:

a plurality of transistors sharing a source or a drain are connected in series;

said plurality of transistors include first and second transistors sharing said source or said drain and connected in series;

gates of said plurality of transistors are connected to a word line;

one of the first and second ferroelectric capacitor is arranged above said first and second transistors;

said source of said first transistor is connected to said lower electrode of said first ferroelectric capacitor forming said ferroelectric capacitor portion;

said drain of said first transistor and said source of said second transistor provide a common electrode of said first and second transistors;

said common electrode of said first and second transistors is connected to said common electrode of said first and second ferroelectric capacitors forming said ferroelectric capacitor portion; and said drain of said second transistor is connected to said upper electrode of said second ferroelectric capacitor forming said ferroelectric capacitor portion.

17. The semiconductor memory device according to claim 14, wherein each of said first and second ferroelectric films is formed of an oxide ferroelectric film with ionic bonding characteristics and selected from the group consisting of a SrBiTaO series film, a PbZrTiO series film (including PZT; $Pb(Zr_xTi_{1-x})O_3$), a BaSrTiO series film, a $BaTiO_3$ film, a PLZT film, $LiNbO_3$ film and a $K_3Li_2Nb_5O_{15}$ film.

18. The semiconductor memory device according to claim 14, wherein each of said upper electrode, lower electrode and common electrode is formed of a film selected from the group consisting of a Pt film, an Ir film, an $IrO_2$ film, a SrRuO film, a Ru film and a RuO film, and a laminate structure selected from the group consisting of a Ti/Pt laminate film and a Ti/TiN/Pt laminate film.

* * * * *